(12) United States Patent
Gordon et al.

(10) Patent No.: US 8,951,444 B2
(45) Date of Patent: Feb. 10, 2015

(54) GAS-PHASE FUNCTIONALIZATION OF CARBON NANOTUBES

(75) Inventors: Roy G. Gordon, Cambridge, MA (US); Damon B. Farmer, White Planes, NY (US)

(73) Assignee: President and Fellows of Harvard College, Cambridge, MA (US)

(*) Notice: Subject to any disclaimer, the term of this patent is extended or adjusted under 35 U.S.C. 154(b) by 358 days.

(21) Appl. No.: 12/820,615

(22) Filed: Jun. 22, 2010

(65) Prior Publication Data

US 2010/0260927 A1    Oct. 14, 2010

Related U.S. Application Data

(62) Division of application No. 11/703,375, filed on Feb. 7, 2007, now Pat. No. 7,767,114.

(60) Provisional application No. 60/766,000, filed on Feb. 7, 2006.

(51) Int. Cl.
*H01B 1/00* (2006.01)
*C23C 16/00* (2006.01)
(Continued)

(52) U.S. Cl.
CPC .............. *C01B 31/0233* (2013.01); *B82Y 10/00* (2013.01); *B82Y 30/00* (2013.01); *B82Y 40/00* (2013.01);
(Continued)

(58) Field of Classification Search
USPC .................. 252/500–511; 427/248.1, 255.23, 427/255.7; 977/742, 745, 748, 750, 755, 977/842, 878, 890, 891
See application file for complete search history.

(56) References Cited

U.S. PATENT DOCUMENTS 5,698,175 A    12/1997  Hirua et al.
7,767,114 B2   8/2010   Gordon et al.
(Continued)

FOREIGN PATENT DOCUMENTS

WO    2008085183    7/2008
WO    2009132165    10/2009

OTHER PUBLICATIONS

Fu et al. ("Selective Coating of Single Wall Carbon Nanotubes with Thin SiO2 Layer." Nano Letters, 2(4), p. 329-332, Web Mar. 16, 2002).*

(Continued)

*Primary Examiner* — Tri V Nguyen
(74) *Attorney, Agent, or Firm* — Theresa A. Lober

(57) ABSTRACT

In a method for functionalizing a carbon nanotube surface, the nanotube surface is exposed to at least one vapor including at least one functionalization species that non-covalently bonds to the nanotube surface, providing chemically functional groups at the nanotube surface, producing a functionalized nanotube surface. A functionalized nanotube surface can be exposed to at least one vapor stabilization species that reacts with the functionalization layer to form a stabilization layer that stabilizes the functionalization layer against desorption from the nanotube surface while providing chemically functional groups at the nanotube surface, producing a stabilized nanotube surface. The stabilized nanotube surface can be exposed to at least one material layer precursor species that deposits a material layer on the stabilized nanotube surface.

29 Claims, 13 Drawing Sheets

(51) Int. Cl.
| | |
|---|---|
| C01B 31/02 | (2006.01) |
| B82Y 10/00 | (2011.01) |
| B82Y 30/00 | (2011.01) |
| B82Y 40/00 | (2011.01) |
| C01F 7/30 | (2006.01) |
| H01L 51/00 | (2006.01) |
| H01L 51/05 | (2006.01) |

(52) U.S. Cl.
CPC ............ C01B 31/0273 (2013.01); C01F 7/304 (2013.01); H01L 51/0049 (2013.01); C01B 2202/02 (2013.01); C01B 2202/06 (2013.01); C01B 2202/22 (2013.01); C01P 2004/13 (2013.01); H01L 51/057 (2013.01); Y10S 977/742 (2013.01); Y10S 977/70 (2013.01); Y10S 977/847 (2013.01); Y10S 977/748 (2013.01); Y10S 977/745 (2013.01); Y10S 977/75 (2013.01); Y10S 977/755 (2013.01); Y10S 977/842 (2013.01); Y10S 977/878 (2013.01); Y10S 977/89 (2013.01); Y10S 977/891 (2013.01)
USPC .................. 252/502; 427/248.1; 427/255.23; 427/255.7; 977/742; 977/745; 977/748; 977/750; 977/755; 977/842; 977/878; 977/890; 977/891; 977/742; 977/700; 977/847

(56) References Cited

U.S. PATENT DOCUMENTS

| | | | |
|---|---|---|---|
| 8,119,032 | B2 | 2/2012 | Gordon et al. |
| 2002/0110513 | A1* | 8/2002 | Margrave et al. ........... 423/447.2 |
| 2003/0122133 | A1* | 7/2003 | Choi et al. ........................ 257/77 |
| 2003/0124794 | A1 | 7/2003 | Girardie |
| 2004/0144972 | A1* | 7/2004 | Dai et al. .......................... 257/20 |
| 2005/0208304 | A1* | 9/2005 | Collier et al. .................. 428/403 |
| 2006/0081886 | A1 | 4/2006 | Mostarshed et al. |
| 2006/0121724 | A1 | 6/2006 | Yue |
| 2006/0142149 | A1* | 6/2006 | Ma et al. ........................ 502/185 |
| 2006/0211223 | A1 | 9/2006 | Brcka |
| 2007/0012961 | A1* | 1/2007 | Bae et al. ........................ 257/288 |
| 2007/0116627 | A1 | 5/2007 | Collier et al. |
| 2007/0157348 | A1* | 7/2007 | Bae et al. ....................... 977/742 |
| 2007/0212538 | A1 | 9/2007 | Niu |
| 2007/0255002 | A1 | 11/2007 | Alba |
| 2008/0093226 | A1* | 4/2008 | Briman et al. ................. 205/775 |
| 2008/0171316 | A1 | 7/2008 | Golovchenko et al. |
| 2009/0117467 | A1 | 5/2009 | Zhamu et al. |
| 2010/0260927 | A1 | 10/2010 | Gordon et al. |
| 2012/0108075 | A1 | 5/2012 | Gordon et al. |

OTHER PUBLICATIONS

Puurunen ("Surface chemistry of atomic layer deposition: A case study for the trimethylaluminum/water process." AIP, 97, p. 121301-1/52, Online Jun. 30, 2005).*
Lee et al. ("Al2O3 nanotubes and nanorods fabricated by coatingand fillingof carbon nanotubes with atomic-layer deposition." J Cryst Growth, 254, p. 443-448, 2003).*
Javey et al. ("Self-Aligned Ballistic Molecular Transistors and Electrically Parallel Nanotube Arrays." Nano Letters, 4(7), p. 1319-1322, Web Jun. 23, 2004).*
Byl et al. ("Adsorption of CF4 on the Internal and External Surfaces of Opened Single-Walled Carbon Nanotubes: A Vibrational Spectroscopy Study." JACS, 125, p. 5889-5896, Online, Apr. 18, 2003).*
Hermann et al. ("Multilayer and functional coatings on carbon nanotubes using atomic layer deposition." App Phys Let, 87, 123110-1/3, Online Sep. 14, 2005).*
Someya et al. ("Alcohol Vapor Sensors Based on Single-Walled Carbon Nanotube Field Effect Transistors." Nano Letters, 3(7), pp. 877-881, Web May 29, 2003).*
Kong et al. (Nanotube Molecular Wires as Chemical Sensors. Science, 287, p. 622-625, Jan. 28, 2000).*
Seeger et al., "SiOx-coating of carbon nanotubes at room temperature," Chemical Physics Letters, No. 339, pp. 41-46, 2001.
Javey et al., "High-k dielectrics for advanced carbon-nanotube transistors and logic gates," nature materials, vol. 1, pp. 241-245, Nov. 2002.
Becker et al., "Diffusion barrier properties of tungsten nitride films grown by atomic layer deposition from bis (tert-butylimido)bis(dimethylamido)tungsten and ammonia," Appl. Phys. Letts., vol. 82, No. 14, pp. 2239-2241, Apr. 2003.
Han et al., "Coating Single-Walled Carbon Nanotubes with Tin Oxide," Nano Letters, vol. 3, No. 5, pp. 681-683, Apr. 2003.
Whitsitt et al., "Silica Coated Single Walled Carbon Nanotubes," Nano Letters, vol. 3, No. 6, pp. 775-557, May 2003.
Becker et al., "Highly Conformal Thin Films of Tungsten Nitride Prepared by Atomic Layer Deposition from a Novel Precursor," Chem. Mater., No. 15, pp. 2969-2976, Jun. 2003.
Javey et al., "Ballistic carbon nanotube field-effect transistors," Nature, vol. 424, pp. 654-657, Aug. 2003.
Leskela et al., "Atomic Layer Deposition Chemistry: Recent Developments and Future Challenges," Angewandte Chemie, vol. 42, No. 45, pp. 5548-5554, Nov. 2003.
Chin et al., "Optical limiting properties of amorphous SixNy and SiC coated carbon nanotubes," Chem. Phys. Letts., vol. 383, pp. 72-75, 2004.
Javey et al., "Carbon Nanotube Field-Effect Transistors with Integrated Ohmic Contacts and High-k Gate Dielectrics," Nano Letters, vol. 4, No. 3, pp. 447-450, Feb. 2004.
Lim et al., "Atomic layer deposition of lanthanum aluminum oxide nano-laminates for electrical applications," Appl. Phys. Letts., vol. 84, No. 20, pp. 3957-3959, May 2004.
Peng et al., "Coulomb blockade in suspended Si3N4-coated single-walled carbon nanotubes," Appl. Phys. Letts., vol. 84, No. 26, pp. 5428-5430, Jun. 2004.
Javey et al., High-Performance n-Type Carbon Nanotube Field-Effect Transistors with Chemically Doped Contacts, Nano Letters, vol. 5, No. 2, pp. 345-348, Jan. 2005.
Farmer et al., "ALD of High-k Dielectrics on Suspended Functionalized SWNT's," Electrochemical and Solid-State Letts., vol. 8, No. 4, pp. G89-G91, Feb. 2005.
Aaltonen et al., "ALD of Rhodium Thin Films from Rh(acac)3 and Oxygen," Electrochemical and Solid-State Letts., vol. 8, No. 8, pp. C99-C101, Jun. 2005.
Kim et al., Electrical contacts to carbon nanotubes down to 1 nm in diameter, Appl. Phys. Letts., vol. 87, pp. 173101-1-173101-3, Oct. 2005.
Kim et al., "Atomic layer deposition of gadolinium scandate films with high dieletric constant and low leakage current,"Appl. Phys. Letts., vol. 89, pp. 133512-1-133512-3, Sep. 2006.
Hausmann et al., "Highly conformal atomic layer deposition of tantalum oxide using alkylamide precursers," Thin Solid Films, vol. 443, pp. 1-4, 2003.
Lu et al., "DNA Functionalization of Carbon Nanotubes for Ultrathin Atomic Layer Deposition of High k Dielectrics for Nanotube Transistors with 60 mV/Decade Switching," J. Am. Chem. Soc., vol. 128, pp. 3518-3519, Mar. 2006.
Farmer et al., Atomic Layer Deposition on Suspended Single-Walled Carbon Nanotubes via Gas-Phase Noncovalent Functionalization, Nano Letters, vol. 6, No. 4, pp. 699-703, Mar. 2006.
PCT/US2008/007228, International Search Report, Form PCT/ISA/210 first sheet, second sheet pp. 1-2, and patent family index, and Written Opinion of the International Searching Authority, Form PCT/ISA/237 Cover Sheet pp. 1-3 and Separate sheet 1-2, Oct. 2008.
Williams et al., "Quantum Hall Effect in a Gate-Controlled p-n Junction of Graphene," Science, vol. 317, pp. 638-641, Jun. 2007.
PCT/US2007/003268, International Search Report, Form PCT/ISA/210 first sheet, second sheet pp. 1-2, continuation of first sheet (2), and patent family index, and Written Opinion of the International Searching Authority, Form PCT/ISA/237 Cover Sheet pp. 1-3 and Separate sheet 1-3, May 2010.
Peng et al, "Chemical control of nanotube electronics," Nanotechnology, vol. 11, pp. 57-60, 2000.

(56) References Cited

OTHER PUBLICATIONS

Chang et al., "Adsorption of NH3 and NO2 molecules on carbon nanotubes," Appl. Phys. Letts., vol. 79, No. 23, pp. 3863-3865, Dec. 2001.

Peng et al, "Ab initio study of CNT NO2 gas sensor," Chem. Phys. Letts., vol. 387, pp. 271-276, 2004.

Santucci et al., "NO2 and CO gas adsorption on carbon nanotubes: Experiment and theory," J. Chem. Phys., vol. 119, No. 20, pp. 10904-10910, Nov. 2003.

Chen et al., Noncovalent Sidewall Functionalization of Single-Walled Carbon Nanotubes for Protein Immobilization, JACS, vol. 123, pp. 3838-3839, Apr. 2001.

Lu et al., "Adsorption configuration of NH3 on single-wall carbon nanotube," Chem. Phys. Letts., vol. 405, pp. 90-92, Jan. 2005.

George, "Atomic Layer Deposition (ALD) and iMINT Research Highlights," http://imintcenter.org/research/7_GEORGE_ALD.pdf, slides 1-24, Nov. 2007.

Chen, Externally Assembled Gate-All-Around Carbon Nanotube Field-Effect Transistor, IEEE Elec. Dev. Letts., vol. 29, No. 2, pp. 183-185, Feb. 2008.

Williams et al., "Quantum Hall Effect in a Graphene p-n Junction," arXiv:0704.3487v1 [cond-mat.mes-hall], Apr. 2007.

Xuan et al., "Atomic-layer-deposited nanostructures for graphene-based nanoelectronics," Appl. Phys. Letts., vol. 92, No. 1, pp. 013101 1-013101 3, Jan. 2008.

Lee et al., "Conformal Al2O3 dielectric layer deposited by atomic layer deposition for graphene-based nanoelectronics," Appl. Phys. Letts., vol. 92, No. 20, pp. 203102-1-203102-3, May 2008.

Wang et al., Atomic Layer Deposition of Metal Oxides on Pristine and Functionalized Graphene, JACS, vol. 130, No. 26, pp. 8152-8153, Jun. 2008.

Leskela et al., "Atomic layer deposition (ALD): from precursors to thin film structures," Thin Solid Films, vol. 409, pp. 138-146, Mar. 2002.

Chinese Patent Application No. 200780012343.8, Chinese Patent Office Communication, pp. 1-7, Nov. 2011.

Chinese Patent Application No. 200780012343.8, Response to Chinese Patent Office Communication, pp. 1-6, Jun. 2012.

European Patent Application No. EP07872140.4-1218, European Patent Office Communication, pp. 1-3, Feb. 2012.

European Patent Application No. EP07872140.4-1218, Response to European Patent Office Communication, pp. 1-9, Aug. 2012.

U.S. Appl. No. 13/344,738, USPTO Examiner Action, pp. 1-6; Mar. 2013.

U.S. Appl. No. 13/344,738, Response to USPTO Examiner Action of Mar. 2013, pp. 1-11, May 2013.

U.S. Appl. No. 13/344,738, USPTO Examiner Action, pp. 1-5, Aug. 2013.

Chinese Patent Appl. No. CN20070012343, Second Examiner Communication, pp. 1-2, Aug. 2012.

Chinese Patent Appl. No. CN20070012343, Response to Second Examiner Communication, pp. 1-17, Dec. 2012.

U.S. Appl. No. 13/344,738, USPTO Examiner Action, pp. 1-7; Mar. 2014.

U.S. Appl. No. 13/344,738, Response to USPTO Examiner Action of Aug. 2013, pp. 1-15, Jan. 2014.

\* cited by examiner

GAS-PHASE FUNCTIONALIZATION OF CARBON NANOTUBES

CROSS-REFERENCE TO RELATED APPLICATIONS

This application is a divisional of co-pending application U.S. Ser. No. 11/703,375, filed Feb. 7, 2007, the entirety of which is hereby incorporated by reference and which claims the benefit of U.S. Provisional Application No. 60/766,000, filed Feb. 7, 2006, the entirety of which is also hereby incorporated by reference.

STATEMENT REGARDING FEDERALLY SPONSORED RESEARCH

This invention was made with Government support under Contract No. CTS-0236584 awarded by NSF. The Government has certain rights in the invention.

BACKGROUND OF THE INVENTION

This invention relates to carbon nanotubes, and more particularly relates to techniques for forming layers of material on the surface of carbon nanotubes.

Carbon nanotubes are being employed increasingly for a wide range of nanosystems and nanodevices. The unique electronic structure, exceptional elastic properties, and extremely high aspect ratio all characteristic of carbon nanotubes address many considerations that are currently of interest for nanosystems and nanodevices. In the microfabrication of such carbon nanotube-based systems and devices, it can be desirable or required to deposit one or more layers of material on a nanotube surface. Coaxial coating of a carbon nanotube, such that the longitudinal coaxial surface of the nanotube is substantially fully surrounded by one or more coated layers, can be particularly desirable, for, e.g., providing a coaxially symmetric nanotube structure and material properties. Surround-gate transistors and other device configurations are particularly reliant on such a coaxial coating arrangement. Further, suspended carbon nanotube-based device geometries, often employed for sensing applications, generally are preferably implemented with a coaxially-coated nanotube.

A nanotube wall configuration, electronic structure, and surface properties can all impact the ability to deposit a selected material on the surface of a nanotube. For example, uniform, conformal coating of multi-walled carbon nanotubes (MWNTs) can under some conditions be accomplished by atomic layer deposition (ALD). ALD allows for the deposition of a wide variety of materials at relatively low processing temperatures with superior thickness precision and high composition uniformity, and therefore is an attractive deposition technique for many applications. By enabling such a high degree of deposition precision, ALD well-addresses carbon nanotube nano-scale geometries and overcomes the limitations of CVD deposition techniques. But for many applications, it is understood that MWNTs can be coated by an ALD process only because MWNTs are characterized by the existence of defects, at nanotube surfaces, that can act as nucleation sites for ALD precursors. MWNT ALD coatings therefore cannot be guaranteed to be reproducible or uniform. Single-walled carbon nanotubes (SWNTs) are characterized by a much more ideal and defect-free surface structure than MWNTs. SWNTs are found to be chemically inert to ALD precursor molecules. As a result, continuous ALD coating onto a SWNT by ALD is not in general conventionally achievable for any process conditions.

Other similar scenarios exist in which a selected coating material or coating process is found incompatible with a chosen nanotube wall structure or other configuration. For example, chemical vapor deposition processes (CVD) in general cannot be guaranteed to produce a uniform nanotube coaxial coating, and can require plasmas or deposition temperatures that are so high as to impact the electrical or mechanical properties of a nanotube. For many process conditions, SWNTs are chemically inert to CVD precursors at CVD temperatures less than about 400° C. Although physical deposition methods (PVD), such as sputtering or evaporation, can sometimes deposit metals or other materials directly onto SWNTs, such deposits are not conformal, and do not uniformly surround the tubes due to, e.g., the directional nature of the methods. A "conformal" coating on a nanotube is here meant to refer to a coating that wraps completely around the nanotube with uniform thickness on all sides. It is therefore difficult to reliably and benignly make conformal layers of material around a nanotube.

For many applications, it is desirable to coat a nanotube uniformly and conformally with insulating and metallic materials in the formation of an electronic device such as a coaxially-gated nanotube transistor. But in general it can be difficult to uniformly and conformally coat a nanotube, and particularly a SWNT, with selected materials. As explained above, SWNTs are inert to ALD precursors and therefore cannot be coated by an ALD process. CVD and PVD techniques do not reliably produce a thin, uniform and conformal layer on a nanotube. Liquid-chemical deposition methods are known to enable the coating of SWNTs with $SiO_2$, which is a low-κ dielectric, but do not enable the deposition of higher-κ materials on a nanotube.

It has been suggested that to overcome this difficulty, a nanotube surface can first be functionalized to render the surface susceptible to deposition precursor molecules, thereby to enable deposition by a selected technique such as ALD. For example, a liquid-based technique can be employed for functionalizing a SWNT surface by covalent chemical bonding of a functionalization layer to the SWNT surface. The resulting layer provides functional groups, covalently bonded to the nanotube longitudinal sidewall, that are reactive with deposition precursors such as ALD precursor molecules.

While this technique indeed enables uniform ALD film deposition on covalently functionalized SWNT surfaces, the liquid-based process is procedurally tedious and could be impractical for large-scale fabrication scenarios. Furthermore, the covalent nature of the chemical bonding process can in general change the hybridization state of a nanotube, destroying optoelectronic and/or other properties of the nanotube. A post-functionalization heat treatment or other process can be required to recover the initial hybridization state of such a functionalized nanotube. As a result, it has heretofore been impractical to employ covalent functionalization as a means for enabling uniform deposition of a selected material, and particularly an insulating material, on a nanotube.

SUMMARY OF THE INVENTION

The invention overcomes the limitations of covalent-bonding, liquid-based nanotube surface functionalization techniques by providing a functionalization method that requires only weak, physical bonding, such as non-covalent bonding, to a carbon nanotube, via vapor processing, to produce a functionalization layer on the nanotube.

In one method provided by the invention for functionalizing a carbon nanotube surface, the nanotube surface is exposed to at least one vapor including at least one functionalization species that non-covalently bonds to the nanotube surface, providing chemically functional groups at the nanotube surface to produce a functionalized nanotube surface. A functionalized single-walled carbon nanotube is thereby provided having a coaxial nanotube structure including a functionalization layer that is non-covalently bonded to the nanotube surface and that provides chemically functional groups over the nanotube surface. The functionalized nanotube surface can be exposed to at least one material layer precursor species that deposits a material layer on the functionalized nanotube surface.

In accordance with the invention, a functionalized nanotube surface can be exposed to at least one vapor stabilization species that reacts with the functionalization layer to form a stabilization layer that stabilizes the functionalization layer against desorption from the nanotube surface while providing chemically functional groups at the nanotube surface to produce a stabilized nanotube surface. The stabilized nanotube surface can then be exposed to at least one material layer precursor species that deposits a material layer on the stabilized nanotube surface.

In one example functionalization and stabilization process provided by the invention, exposure of a nanotube to $NO_2$ vapor and trimethylaluminum vapor is cyclically alternated for between 25 and 50 exposure cycles, and then exposure of the nanotube to water vapor and trimethylaluminum vapor is cyclically alternated for at least 5 exposure cycles.

The invention exploits this process to provide a method for forming a coaxial carbon nanotube transistor gate. In this method, a substantially full coaxial surface of a nanotube is exposed to at least one vapor including at least one functionalization species that non-covalently bonds to the nanotube surface, providing a functionalization layer of chemically functional groups to produce a functionalized nanotube surface. Then the functionalized nanotube surface is exposed to at least one vapor stabilization species that reacts with the functionalization layer to form a stabilization layer that stabilizes the functionalization layer against desorption from the nanotube surface while providing chemically functional groups at the nanotube surface to produce a stabilized nanotube surface. The stabilized nanotube surface is then exposed to at least one material layer precursor species that deposits an electrically insulating layer on the stabilized nanotube surface. The electrically insulating layer is then exposed to at least one material layer precursor species that deposits an electrically conducting layer on the insulating layer.

This process can be extended to form a single-walled carbon nanotube semiconductor device, with a single-walled carbon nanotube synthesized between electrically conducting source and drain contact pads, and an electrically insulating layer formed by vapor deposition, such as atomic layer deposition or chemical vapor deposition, on at least a portion of the source and drain contact pads and over ends of the single-walled carbon nanotube, leaving a coaxial surface of the single-walled carbon nanotube uncoated by the vapor deposition. Then the functionalization and stabilization steps can be carried out. A gate dielectric layer can then be formed around the stabilized coaxial nanotube surface and a gate metal layer can be deposited on the gate dielectric layer.

The carbon nanotube functionalization method of the invention avoids covalent chemical modification of nanotubes, thereby preserving their remarkable electrical, mechanical and optical properties. Once a carbon nanotube surface is functionalized in accordance with the invention, vapor or liquid processing of the nanotube can be carried out to uniformly deposit one or more layers of material on the nanotube for, e.g., the production of nanotube based electronic elements, circuits, devices, and systems. Other features and advantages of the invention will be apparent from the following description and accompanying figures, and from the claims.

DETAILED DESCRIPTION OF THE INVENTION

The functionalization process of the invention can be carried out on a nanotube of any selected wall configuration, including single-walled nanotubes (SWNTs) and multi-walled nanotubes (MWNTs), and can be carried out on a nanotube of any selected electrical state, including metallic or semiconducting nanotubes. For any of these conditions, the functionalization process of the invention produces a functionalization layer that is physically bonded to the outside surface of a nanotube in a benign manner that avoids chemical modification of nanotubes, thereby preserving the electrical, optical, and mechanical properties of the nanotube. While not chemically bonded to the nanotube surface, the functionalization layer of the invention provides chemically-active functional groups at the nanotube surface that are reactive to deposition precursors for depositing a material layer uniformly over the functionalization layer. The functionalization layer of the invention thereby preserves the nanotube properties while providing a nanotube surface condition that facilitates subsequent deposition of a uniformly thick film or films all over the surface of the nanotube.

Once a carbon nanotube surface is functionalized in accordance with the invention, vapor or liquid processing of the nanotube can be carried out to deposit one or more layers of material on the nanotube in a precise, reliable, conformal manner. ALD techniques, chemical vapor deposition (CVD) techniques, plasma deposition techniques, other physical deposition techniques, and solution-based deposition techniques can all be employed to produce on a functionalized carbon nanotube a desired configuration of a material layer or layers. Example functionalization processes provided by the invention and example material deposition processes are described in detail below.

For many applications, it can be preferred to deposit a material on a nanotube in a manner that coaxially coats the nanotube surface, i.e., that surrounds at least a portion of the length of the nanotube. To achieve this condition, it is accordingly preferable to substantially completely coaxially coat a nanotube with a functionalization layer of the invention, along substantially a selected portion or the entire longitudinal sidewall length of the nanotube. This can be accomplished conveniently if the nanotube to be coated is synthesized in an arrangement that provides exposure of the nanotube sidewall circumference along some or all of the nanotube length.

Figure 1A:
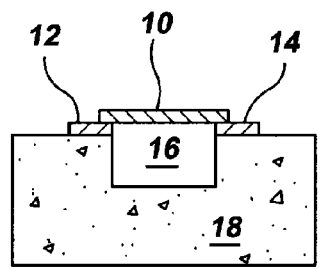
FIG. 1A is a schematic side view of a carbon nanotube suspended over a trench for functionalization in accordance with the invention.

FIG. 1A is an example of such a configuration. Here, a nanotube 10 has been synthesized between two catalyst regions 12, 14 across a trench 16 provided in a substrate structure 18. The suspension of the nanotube across the trench provides complete access to the nanotube sidewall, thereby enabling the formation of a functionalization layer around the entire nanotube. In contrast, in an arrangement like that shown in FIG. 1B, nanotubes 10 that are synthesized lying flat on a substrate 18 are not fully exposed to the ambient, and cannot in one step be fully coated with a functionalization layer.

Figure 1B:
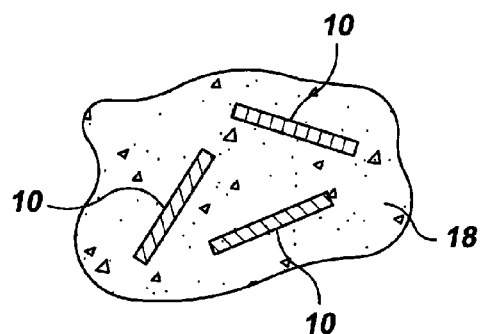
FIG. 1B is a schematic planar view of carbon nanotubes disposed on a surface for functionalization in accordance with the invention.

In accordance with the invention, nanotubes that are synthesized in the configuration of FIG. 1B can be manually manipulated to be arranged in a suspended configuration like that of FIG. 1A, or other suitable configuration, for enabling full coating. For example, nanotubes can be moved to positions over holes or trenches by flowing after growth in another selected location. Alternatively, the nanotubes can be maintained flat on a surface and multiple coating cycles be employed with manual rotation of the nanotubes between each cycle.

Figure 1C:
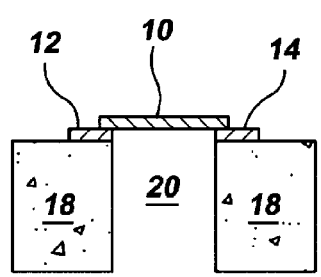
FIGS. 1C-1D are schematic side and planar views, respectively, of a carbon nanotube suspended over a through-hole in a support structure for functionalization in accordance with the invention.
Figure 1D:
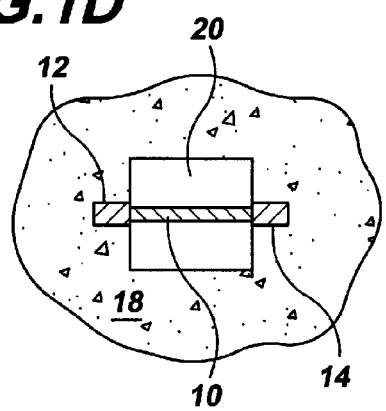

Turning to FIGS. 1C-1D there is shown a second example of a suspended nanotube configuration. In this example, a nanotube 10 has been synthesized between two catalyst regions 12, 14 across a through-hole 20 in a substrate 18. As shown in FIG. 1D, the through-hole can be square, or can be of another selected geometry, either straight or curved. The trench 16 of the example of FIG. 1A likewise can be of any suitable geometry across which a nanotube can be synthesized. Where a through-hole is preferred, such can be provided in a substrate, as in FIGS. 1C-1D, or through a self-supported membrane or other suitable structure.

Figure 1E:
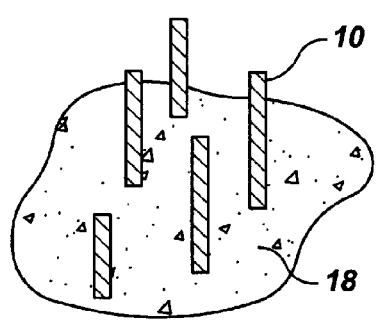
FIG. 1E is a schematic view of carbon nanotubes disposed vertically from a substrate for functionalization in accordance with the invention.
Figure 1F:
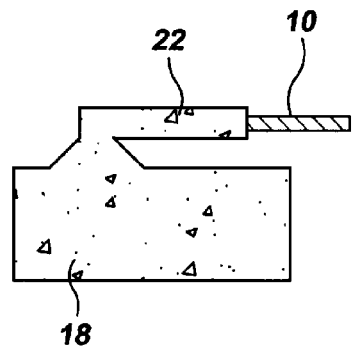
FIG. 1F is a schematic view of a carbon nanotube suspended from the edge of a beam for functionalization in accordance with the invention.

As shown in FIG. 1E, nanotubes 10 can alternatively be synthesized vertically, grown down or up like blades of grass from the surface of a substrate 18 on which is provided catalyst regions or a blanket catalyst layer. This synthesis arrangement provides full circumferential access to the nanotubes for forming a functionalization layer fully around the nanotubes. In this arrangement, the nanotubes are anchored to a substrate only at one end, and can be maintained in this rooted configuration during functionalization and coating processes. Such a condition can also be achieved in a horizontal arrangement, shown in FIG. 1F. Here a nanotube 10 is synthesized from the end of a horizontal structure, e.g., a beam 22 provided on a substrate 18. A nanotube catalyst region can be provided at a selected location on the beam or along the beam length.

In the examples of FIGS. 1A and 1C-1F, one or more carbon nanotubes are synthesized in place in a selected arrangement that is convenient for coating the full circumference of the nanotube surface along the nanotube length. This can be extended to synthesis of a nanotube in place in a selected device or system configuration for which the nanotube is intended, where the full circumference of the nanotube is to be exposed during operation. Examples of such devices are described in detail below. But as explained above, where such is not the case, nanotubes can be synthesized in any desired fashion and then arranged to expose their full coaxial surface for functionalization of the full surface, or can be manipulated such that repeated functionalization steps produce a functionalization layer on the full surface. Where it is not required to functionalize the full surface of a nanotube, the nanotube can be provided in an arrangement such as FIG. 1B with a selected surface region to be functionalized made accessible to the functionalization process.

The invention does not require any particular nanotube synthesis process and is not limited to a particular process. Nanotubes can be obtained from commercial sources or synthesized in a desired manner and with selected characteristics such as wall number and electrical conductivity. Example nanotube synthesis techniques and configurations that can be employed in accordance with the invention are described in U.S. Patent Application Publication No. US 2006/0006377, entitled "Suspended Carbon Nanotube Field Effect Transistor," Published Jan. 12, 2006, the entirety of which is hereby incorporated by reference.

For example, nanotube catalyst materials of, e.g., Fe, Co, Ni, alloys of such, or other metals or suitable materials, can be provided in a patterned configuration or a blanket arrangement on a substrate or other structure, in the conventional manner, for synthesis of nanotubes therefrom. Where it is desirable to synthesize a nanotube in situ in a selected device configuration, catalyst regions can be provided on, e.g., metal contact pads, in the manner described below, such that a resulting nanotube device configuration includes electrical connection points at ends of the nanotube. For applications in which a nanotube is to be synthesized across a through-hole, the catalyst material can be provided on a substrate or membrane in an arrangement such that the through-hole can be formed in one step through the catalyst and the underlying substrate or membrane to provide alignment of the edge of the catalyst region with the edge of the through-hole. For applications in which SWNTs are desired, a relatively thin catalyst layer, e.g., of 2 nm in thickness or less, can be preferred.

Nanotube synthesis can be carried out by CVD or other selected vapor deposition process. In one example process, $CH_4$ is flowed, at a rate of, e.g., about 200 sccm, at a temperature of, e.g., about 900° C., for a selected duration, e.g., up to about 5 minutes in a CVD chamber. In a further example synthesis process, argon gas is flowed at, e.g., about 450 sccm, at atmospheric pressure, through anhydrous liquid ethanol at 25° C., room temperature, with the vapor mixture then flowed over a catalyst-coated region at a temperature of, e.g., between about 750° C.-900° C., in, e.g., an Inconel annealing tube, for a duration of, e.g., between about 30 s and 30 min. Other synthesis processes can also be employed.

With these example nanotube synthesis techniques, nanotubes can be grown across through-holes or trenches provided in substrates or membranes, can be grown vertically up or down from a catalyst surface, or can be grown from the edge of a beam or other structure. Multiple nanotubes can be expected to grow from each catalyst region and remain at least partially suspended over holes or trenches or from anchor points such as beams or other surfaces. Once one or more nanotubes are synthesized or arranged in a manner that accommodates formation of a functionalization layer on a selected region of the nanotube or the complete wall surface of the nanotube, the functionalization process of the invention is carried out to enable deposition of additional selected material layers on the nanotube.

The functionalization process of the invention produces at the nanotube surface a functionalization layer that is substantially conformal and uniform and that provides chemically functional groups amenable to deposition of a material layer thereon and/or that can react with coating precursors such as ALD precursor molecules. The functionalization layer does not, however, significantly disrupt the electronic structure or other properties of the nanotube and therefore is benign to the nanotube. Accordingly, in the functionalization process, there is delivered to the nanotube surface a species that can physically attach to the surface for uniformly coating the surface but which does not chemically react with the surface. The functionalization layer is physisorbed at the nanotube surface but is not chemisorbed at the nanotube surface.

Such a condition can for many cases be characterized as non-covalent bonding. Covalent bonding typically characterizes a condition in which localized interaction between species can trap electrons and disrupt electronic properties. The functionalization process of the invention avoids this condition by employing a functionalization species that does not result in localized electronic interaction with the nanotube surface. The non-covalent physical bond of the functionalization species to a nanotube surface is strong enough to hold the species in place for at least a limited duration, but is reversible, and therefore can desorb from the surface. With this condition, the physical bond is not of a nature that perturbs the structure of the nanotube surface.

One example functionalization species that can be employed in accordance with the invention is $NO_2$. $NO_2$ is characterized by a high binding efficiency that results from low lying electronic states. This high binding efficiency, in combination with a tendency to strong Van der Waals attraction, enables $NO_2$ to physically bond to a nanotube surface without chemically bonding to the surface. Without chemical bonding to the surface, the $NO_2$ does not strongly perturb the surface electronically or chemically. $NO_2$ can be delivered to a nanotube surface as a gaseous vapor species. For many applications, it is preferred in accordance with the invention that the functionalization species be a vapor species, rather than a liquid species, for enabling precision in deposition as well as for convenience. $NO_2$ thereby is particularly well-suited as a functionalization species.

The characteristics of $NO_2$ given just above generally describe the requirements of a functionalization species of the invention. The functionalization species should be adsorbed on and non-covalently physically bond to, or physisorbed on, a nanotube surface without significantly perturbing the chemical and/or electronic states of the nanotube. The physisorbed functionalization species should be capable of operating as nucleation sites for reaction with one or more precursors for depositing a material layer on the nanotube. The functionalization species should also preferably be deliverable to a nanotube surface in the vapor phase.

The invention is not limited to the $NO_2$ functionalization example. Any species that provides the surface-bonding and precursor-reaction characteristics described above can be employed as a functionalization species. For example, methyl nitrite gas, $CH_3ONO$, can be employed in place of $NO_2$ gas.

Species and processes that result in covalent bonding with a nanotube surface cannot be employed in the functionalization process of the invention. For example, layers of some metals, such as Ti and Cr, are understood to impact the electronic state of nanotubes and to covalently bond to the nanotube surface. As a result, such metals cannot be employed as a functionalization species in the functionalization process of the invention. In contrast, $NO_2$ does not substantially alter the electrical state of nanotubes to which it is attached. Any nanotube conduction enhancement produced by an $NO_2$ coating, e.g., a slight p-type conduction enhancement that is known to be characteristic of $NO_2$ coating on nanotubes, is almost entirely due to electrostatic modification at the metal/nanotube interface by Schottky barrier modification, as described in detail below. $NO_2$ does not interact electronically in the sense that covalent bonds are not formed with the nanotube lattice and the hybridization state, i.e., the electronic state, of the nanotube is therefore not changed by the $NO_2$.

Furthermore, as metals, Cr and Ti, as well as other electrically conducting materials, cannot be employed as a surface coating on a nanotube that is to be employed as, e.g., a semiconducting element such as a transistor gate. A metal layer on a nanotube gate surface would dominate electrical current transport along the nanotube gate by providing a pathway for electrons to travel through the metal, rather than the semiconducting nanotube, thereby eliminating the requisite transistor gate switching capabilities.

Particular deposition processes can also alter the properties of a nanotube and are therefore cannot be employed as a functionalization process. For example, high-temperature CVD processes, typically operated at temperatures over 400° C., are known to deleteriously impact the electrical transport properties of nanotubes by changing the electronic structure of nanotubes. This is understood to occur due to a bonding arrangement that is not non-covalent. In other words, the high-temperature CVD process causes formation of covalent bonds with a nanotube that change the electrical properties of the nanotube. In contrast, the low-temperature vapor deposition process of the invention does not form with a nanotube covalent bonds that could alter the electrical properties of the nanotube.

Considering now the $NO_2$ functionalization species in more detail, it is found that the physical bond of $NO_2$ species to a nanotube surface is reversible, as mentioned above. In other words, adsorbed $NO_2$ molecules tend to desorb from a nanotube surface over time. As a result, although a layer of $NO_2$ molecules coated on a nanotube surface will act as nucleation sites for deposition of a selected material layer on the nanotube, the $NO_2$ molecules will not in general remain on the nanotube surface for a duration that is sufficiently long to enable the desired material layer deposition. The challenge is to form a continuous layer of $NO_2$ that is preserved for a duration sufficient to carry out a selected material deposition process.

In accordance with the invention, this is achieved by depositing, preferably from the vapor phase, a layer of $NO_2$ at a temperature that preserves $NO_2$ molecules on a nanotube surface for a duration sufficient to introduce a second functionalization species to react with the $NO_2$ molecules and form a species that is not so easily desorbed from the nanotube surface. The reaction of the $NO_2$ and the second functionalization species forms a more stable complex that does not so rapidly desorb from a nanotube surface and that maintains nucleation sites for deposition of a material and/or reaction with a selected deposition precursor.

Any suitable species that is sufficiently volatile and reactive to bind to the $NO_2$ and stabilize the $NO_2$ on the surface of a nanotube can be employed in the functionalization technique. One example and preferred reactive second functionalization species is $Al(CH_3)_3$ (trimethylaluminum or TMA), but other reactants, such as dimethylzinc, trimethylgallium, trimethylindium, trimethylbismuth, tetrakis(dimethylamido) hafnium or tetrakis(dimethylamido)zirconium, can also be used. Whatever reactive second functionalization species is selected, it preferably binds to the $NO_2$ and stabilizes the $NO_2$ on the surface of a nanotube. The invention is not limited to a particular reactive second functionalization species, and instead requires only that the result of a reaction of the selected species with, e.g., $NO_2$ or other selected first functionalization species, not strongly perturb the electronic or chemical state of the nanotube and provide nucleation sites for deposition of a material layer on the nanotube surface.

In one example and well-suited process provided by the invention, a cyclic ALD technique can be employed to introduce vapor $NO_2$ to a nanotube surface and then to expose the adsorbed $NO_2$ molecules to vapor $Al(CH_3)_3$, such that the $Al(CH_3)_3$ reacts with the $NO_2$ molecules. The reaction of the $Al(CH_3)_3$ with the $NO_2$ produces a functionalization layer that is non-covalently bonded to the underlying carbon nanotube and that is a stable complex which does not tend to immediately desorb from the nanotube sidewall at a reasonably low temperature, such as room temperature, 25° C. The resulting functionalized surface provides functional groups that are amenable to uniform, conformal coating of the nanotube by a selected additional material or materials.

Figure 2:
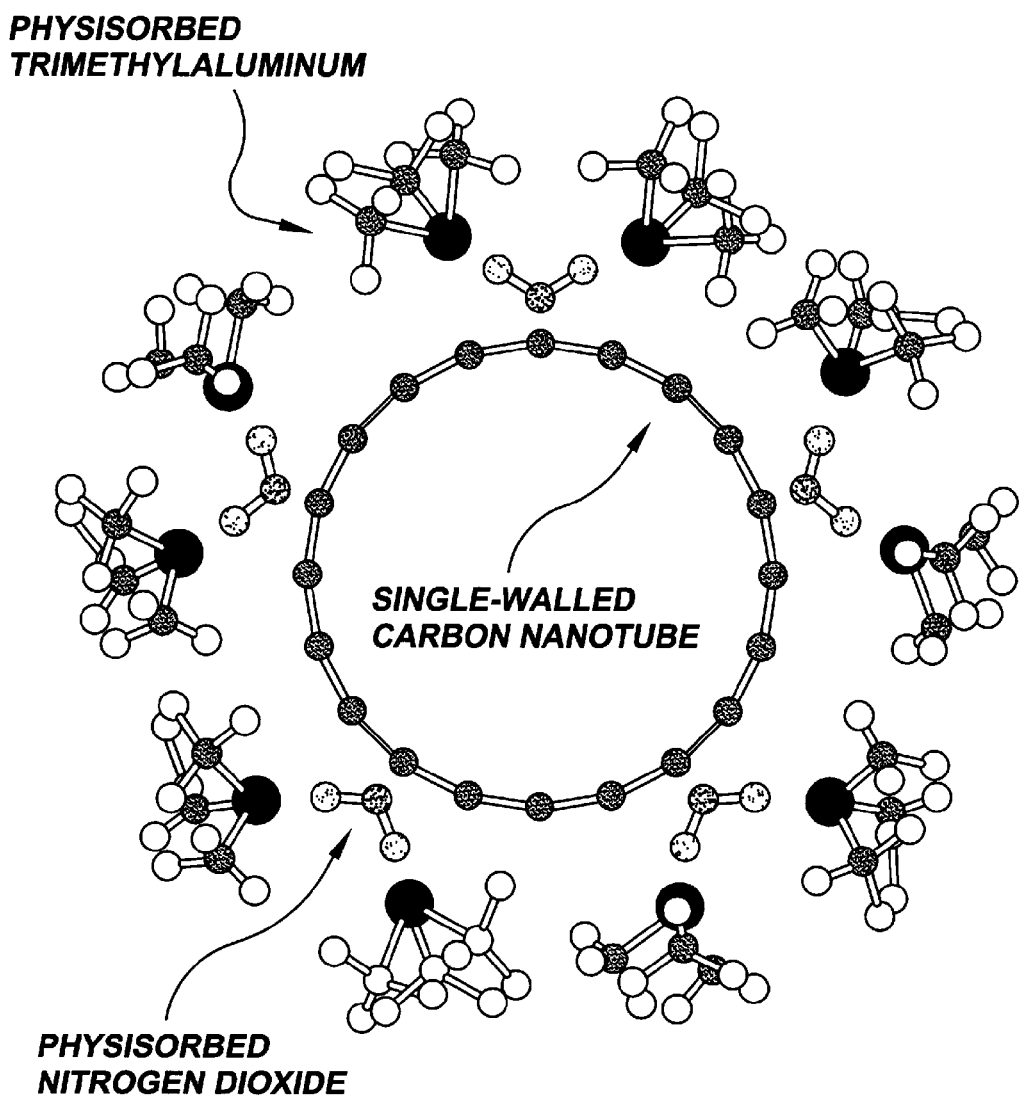
FIG. 2 is a schematic diagram of the reaction mechanism for $Al(CH_3)_3$ with $NO_2$ adsorbed on a single-walled carbon nanotube surface in the functionalization process of the invention.

A plausible reaction mechanism for adsorbed $NO_2$ with TMA is schematically illustrated in FIG. 2. Here, the nitrogen end of $NO_2$ is attracted to the nanotube surface, leaving the oxygen ends exposed to incoming TMA vapor. This is the most stable configuration for adsorbed $NO_2$ molecules on the nanotube surface. The aluminum centers of TMA are in turn attracted to oxygen, leaving the methyl groups as the surface functional groups that are available for reaction with deposition precursors and amenable to deposition conditions. As explained below, this configuration results in self-terminating behavior under a range or processing conditions, preventing further attachment of either $NO_2$ or TMA.

In one example $NO_2$-TMA functionalization process in accordance with the invention, a cyclic ALD technique is employed at a temperature that generally minimizes a tendency of molecular desorption, e.g., about room temperature, 25° C. Throughout the entire functionalization process, a selected flow, e.g., about 50 sccm, of a selected inert gas, e.g., argon gas, is directed through an ALD reactor. An example of such is a cylindrical reactor having an inner diameter of 3.4 cm. The inert gas flow is controlled, e.g., by a vacuum pump with a pumping speed such that the chamber pressure is maintained at, e.g., about 300 mTorr. One example $NO_2$-TMA functionalization cycle consists of a first cycle step providing a dose of, e.g., about 30 mL, of $NO_2$ gas at a pressure of, e.g., about 960 Torr. After this $NO_2$ dose there is carried out an $NO_2$ purge, e.g., a 7 s purge with argon. Then a second cycle step is carried out with a dose of, e.g., about 6 mL, of TMA vapor at a pressure of, e.g., about 10 Torr. This TMA dose is then followed by a 2 min purge with argon. This final purge ends a $NO_2$-TMA cycle. As explained below, the number of such cycles to be repeated is determined based on the completeness of coverage provided by a selected functionalization layer. As will be recognized, the dose size, pressure, and other process parameters are dependent on reactor size and therefore are to be adjusted accordingly for a given reactor and other process conditions.

With this example ALD functionalization process, the residence time, or life time, of the adsorbed $NO_2$ species resulting from the 30 mL dose of $NO_2$ gas is sufficient for the adsorbed $NO_2$ species to remain on the nanotube surface until the TMA vapor is introduced for reaction with the adsorbed $NO_2$ species. The example process temperature of room temperature is one process parameter that can be easily controlled to impose this condition. For many applications, a process temperature of about room temperature, 25° C., can be preferred, but the invention is not limited to room temperature processing. The processing temperature is preferably less than about 200° C. and can be lower than room temperature if such is suitable for a given application.

For many applications, a functionalization layer of one monolayer or at most a few monolayers is all that is required to provide the functional groups necessary for nucleation of a selected material to be deposited subsequently on the functionalization layer surrounding a nanotube. Relatively thick functionalization layers may be porous and not optimally uniform or conformal. In addition, for many applications it can be preferred to limit the amount of material applied to a nanotube. It can therefore be preferred to limit the thickness of a functionalization layer, either through active control or by selection of a process that is characterized by self-limiting behavior.

The example $NO_2$-TMA functionalization process described above is characterized by such self-limiting behavior, limiting a resulting functionalization layer thickness to one monolayer, which is less than about 1 nm in thickness. The self-limiting nature of this reaction can be preserved by limiting the number of functionalization ALD cycles to less than 100 cycles, so that only a controlled, self-limited monolayer of material forms. If the dose number is too large or exposure too great, the $NO_2$-TMA process can produce a thicker amorphous multilayer that is not self-limiting, as described in detail below. Such a multilayer is not a true ALD process and cannot be guaranteed to provide the conformality and uniformity required by the invention. For many applications, less than 100 cycles can be preferred, or more preferably, less than 50 cycles. The number of cycles to be employed should be sufficient to fully or at least nearly completely cover a nanotube surface. For most applications, preferably more than 10 cycles, and more preferably, more than 25 cycles are sufficient for nearly complete coverage.

In general, once a nanotube surface has been exposed to the example $NO_2$-TMA ALD process described above or other selected process, a functionalization layer exists on the nanotube surface and deposition of a selected material around the nanotube can proceed. But although the adsorbed $NO_2$-TMA complex is more stable than adsorbed $NO_2$ by itself, because the $NO_2$-TMA complex is non-covalently attached to the nanotube, the complex will tend to desorb from the nanotube surface given a sufficient amount of time and a sufficiently high temperature.

For conditions under which a selected material cannot be deposited prior to the onset of such functionalization layer desorption, an intermediate stabilization layer can be applied in accordance with the invention to encase the functionalization layer and ensure stability of the functionalization layer even at elevated temperatures and extended durations. The stabilized functionalization layer provides functionalized nucleation sites such that deposition of a selected material layer can then be carried out on the nanotube. Following the functionalization and stabilization steps, the structure can be heated to higher temperatures at which the initial functionalization layer may have desorbed without the stabilization process.

The stabilization process preferably is conducted at a temperature that does not cause enhanced desorption of the underlying functionalization layer. For many applications, a temperature around room temperature, 25° C., can be a preferable stabilization process temperature; a temperature below about 200° C. can be preferred, with temperatures below about 100° C. more preferable. The stabilization layer preferably just covers the underlying functionalization layer and therefore need be no more than one or just a few monolayers in thickness. The stabilization layer holds the functionalization layer in place and preferably forms covalent bonds with the functionalization layer, although such covalent bonds are not essential to the invention.

In one example technique, a selected precursor is introduced to a functionalization layer-coated nanotube for reaction with the layer. The criteria to be met include a requirement that the deposition precursor or precursors for the stabilization layer be reactive with the species of the functionalization layer, e.g., with $NO_2$-TMA functionalization layer species, and be sufficiently volatile at the temperature required to maintain the functionalization layer, e.g., about 25° C., for successful delivery of their vapors to the functionalization layer surface. Precursors that meet these criteria include dimethylamides of various metals, such as hafnium and zirconium, and methyl derivatives of other metals, such as aluminum, zinc, gallium and bismuth. Reaction of such precursors, including trimethylaluminum, dimethylzinc, trimethylgallium, trimethylindium, trimethylbismuth, tetrakis(dimethylamido)hafnium or tetrakis(dimethylamido)zirconium with water vapor can be carried out to form a stabilization layer. It is understood that a $NO_2$-TMA functionalization layer can be exposed to a temperature around 50° C. and for most conditions still be characterized by a reasonably small desorption rate; at this higher temperature an expanded class of stabilization layer precursors can be employed.

In one example and convenient process, a layer of $Al_2O_3$ can be deposited by ALD to form a monolayer-thick stabilization layer over a functionalization layer. Where the functionalization layer is formed by an ALD process, an ALD stabilization process can be particularly convenient. In an example of such a process, a selected flow, e.g., about 50 sccm, of a selected inert gas, e.g., argon gas, is directed through an ALD reactor. An example of such is a cylindrical reactor having an inner diameter of 3.4 cm. The inert gas flow is controlled, e.g., by a vacuum pump with a pumping speed such that the chamber pressure is maintained at, e.g., about 300 mTorr. The temperature is maintained at about room temperature, 25° C. The first step in one stabilization cycle consists of a dose of, e.g., about 6 mL of TMA, at a pressure of, e.g., about 10 Torr, followed by a 2 min purge with argon. Then in a second process step, water vapor at a pressure of, e.g., about 24 Torr, is pulsed for 0.2 sec. The chamber is then purged with argon for, e.g., about 2 min. This completes one ALD cycle in the formation of a stabilization layer.

It is found that for an $NO_2$-TMA functionalization layer, five $Al_2O_3$ ALD cycles with the process conditions given just above provide an adequate stabilization layer, and thus a process including at least five cycles can be preferred. The thickness of an $Al_2O_3$ stabilization layer produced by the five ALD cycles is found to be sufficient to keep $NO_2$-TMA complexes held in place on a nanotube for high temperature processing, and yet is thin enough to minimize any adverse effects that the stabilization layer could have on electrical capacitance.

Thus, in accordance with the invention, in one example of a particularly preferable process, 25-50 ALD cycles of functionalization by $NO_2$-TMA, followed by at least 5 ALD cycles of stabilization by $Al_2O_3$, all at about 25° C., sufficiently functionalizes and stabilizes a nanotube surface for deposition by a selected process, e.g., by conventional ALD. Most nanotubes, and in particular SWNTs, treated with this process of the invention exhibit an ideal coating that is uniform and smooth, conformal and continuous along the entire length of the nanotube.

It is found that without a stabilization layer, a functionalization layer can be radially isotropic but may not in all cases remain continuous along the nanotube length, e.g., producing uncoated regions due to desorption. A similar undesirable condition is found to exist if water vapor alone is employed as a stabilization precursor in an effort to cross-link $NO_2$-TMA complexes in an underlying function layer. A nonuniform functionalization layer is also found to result if the functionalization procedure is carried out at conventional ALD temperatures, which are generally 200° C.-400° C. Here, the thermal kinetic energy gained by $NO_2$ molecules causes a decrease in adsorption onto a nanotube surface, inhibiting functionalization. It is therefore preferred in accordance with the invention that low temperature ALD techniques be employed for the functionalization and stabilization processes.

Once the functionalization and stabilization steps of the invention have been completed, the carbon nanotube can be coated with a selected material by any of a wide range of physical, chemical, vapor, and solution-based deposition processes. Where the deposition process is itself a vapor process, e.g., a CVD process or an ALD process, SWNTs or MWNTs can be grown, their surfaces functionalized and stabilized in accordance with the invention, and their surfaces coated with ALD material, all in the same reactor. The nanotubes can therefore be kept in a controlled vacuum environment throughout the entire process sequence. This eliminates all sources of contamination and ensures that the selected precursors are indeed directly responsible for each step. The ability to execute every process step in one reactor also illustrates the ease with which the functionalization technique of the invention can be integrated into a fabrication process sequence.

It is understood that the conditions for producing a selected layer of stabilization material may not be ideal for producing a layer of that same material as-intended for another purpose. But for many applications, the stabilization layer can be formed of a material that is also to be subsequently deposited in the formation of a selected device. It can therefore be preferred for such a scenario to first form a stabilization layer of the minimum thickness required for stabilizing the functionalization layer, and then to adjust the deposition conditions to form an intended deposited material. For example, as described in detail below, where $Al_2O_3$ is to be employed as a stabilization material and as a device layer in an intended device configuration, then a low-temperature $Al_2O_3$ deposition step can be conducted, followed by an $Al_2O_3$ deposition at temperature and pressure settings that optimize the $Al_2O_3$ layer for the intended application.

The invention contemplates a wide range of devices and structures that can be produced with carbon nanotubes having surfaces that are functionalized in accordance with the invention. A wide range of materials can here be employed. For example, a functionalized carbon nanotube can be coaxially coated with a selected dielectric layer and then a selected electrically conducting layer, to form a gate structure that can be configured between source and drain regions in the formation of a carbon nanotube-based transistor.

One particularly important application addressed by the methods of the invention is ALD of a high-κ dielectric coating, having a dielectric constant greater than, e.g., about 7, on a SWNT. Formation of a high-κ dielectric layer by ALD can produce a benign dielectric/SWNT interface that does not adversely affect the electrical properties of the nanotube. ALD is thus an ideal deposition technique for nondestructively passivating SWNTs with very thin, high-κ materials. Coaxial coating is particularly desirable because its realization in accordance with the invention makes coaxially-gated SWNT devices and nanotube-based wires and other circuit elements feasible, as described below. This configuration maximizes the capacitive coupling of the nanotube with a gate layer, which is a crucial step towards optimizing device characteristics. Furthermore, a suspended SWNT geometry may be necessary to satisfy scalability requirements for nanoscale SWNT devices. Such a structure necessitates coaxial insulation.

Example I $NO_2$ Adsorption and Desorption from a Carbon Nanotube

The electrical conductance of SWNTs was experimentally analyzed during the functionalization procedure of the invention. To produce structures for analysis, optical lithography and electron beam evaporation techniques were employed to pattern metal electrodes of 50 nm-thick Mo and 50 nm-thick Ti layers on quartz substrates. A focused ion beam (FIB) was employed to form trenches of 1 μm in width and 0.5 μm in depth between the edges of the metal electrodes. A layer of approximately 0.5 nm in thickness of $Al_2O_3$ was deposited by ALD on the electrode surfaces to prevent alloying between the molybdenum and the nanotube catalyst metal subsequently deposited. A catalyst region of Co of about 0.3 nm in thickness was deposited and patterned by liftoff on the electrode surfaces to form isolated catalyst regions.

SWNT synthesis was carried out at atmospheric pressure by bubbling argon at a flow rate of about 450 sccm through ethanol at room temperature, 25° C., and flowing the mixture over the quartz substrate structures at a temperature between about 750° C. and about 900° C. in an Inconel® tube having a 3.4 cm inner diameter and a 860 mL volume. Growth times were varied between 30 s and 5 min. The longer growth times produced longer tubes.

For electrical conductance studies, a 30 s growth time was used, to avoid surface bridging of the electrodes by nanotubes. This was not desirable given that the conductance properties of suspended nanotubes were being studied. Growing for a relatively short time ensured that the tubes bridging the electrodes were suspended over the trench between the electrodes. During the synthesis, SWNTs became electrically accessible by growing over the trench between the electrodes. Semiconducting SWNTs grown in this way exhibit p-type behavior.

To analyze the adsorption of $NO_2$ on a nanotube surface, approximately 30 mL doses of $NO_2$ at a pressure of about 960 Torr were pulsed over the SWNTs suspended across the trenches, between the electrodes, under steady state conditions in vacuum conditions of about 300 mTorr and a temperature of about 25° C. Between each pulse, the $NO_2$ was purged with a continuous flow of argon of about 50 sccm for 2 min.

Figure 3A:
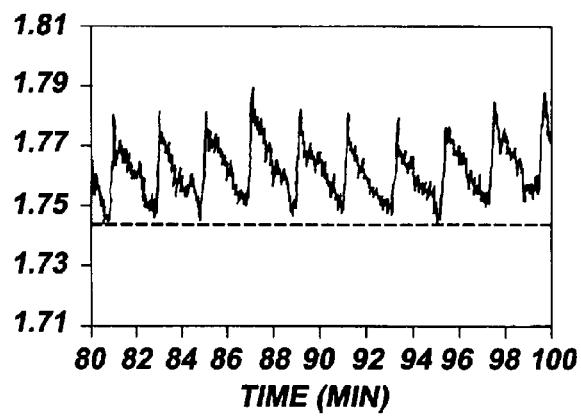
FIG. 3A is a plot of measured conductance of a SWNT as a function of time as $NO_2$ is adsorbed and desorbed from the surface of the SWNT.

FIG. 3A is a plot of the measured conductance of one of the suspended SWNTs as a function of time as the $NO_2$ pulsed dosing was carried out. It was found that the measured conductance of the SWNTs increased upon $NO_2$ exposure and was followed by recovery to the initial baseline conductance during the purge. This is expected because in semiconducting SWNTs, adsorption of the $NO_2$ slightly enhances the p-type character of the nanotube through partial charge transfer of electrons from the tube to the adsorbed $NO_2$ molecules. Thus, during the $NO_2$ dosing, the conductance increased. Then, when the $NO_2$ was purged, the adsorbed $NO_2$ began to desorb, reducing the p-type character of the nanotube and correspondingly reducing the conductance of the nanotube. This conductance analysis confirms that the $NO_2$ species is only physisorbed to the nanotube surface and is not chemically bonded to the surface.

Example II

TMA Stabilization of Adsorbed $NO_2$

Suspended SWNTs were fabricated in the configuration of Example I and exposed to pulsed dosing of TMA. Here approximately 6 mL doses of TMA at a pressure of about 10 Torr were pulsed over suspended SWNTs under the same conditions that were used in the $NO_2$ pulsing of Example I. During the pulsed dosing the conductance of the SWNTs was measured.

Figure 3B:
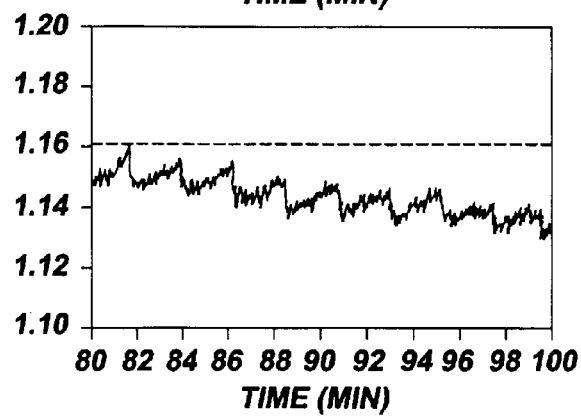
FIG. 3B is a plot of measured conductance of a SWNT as a function of time as $Al(CH_3)_3$ is adsorbed and desorbed from the surface of the SWNT.

FIG. 3B is a plot of measured conductance of a SWNT as a function of time during pulsed TMA dosing. TMA exposure has an effect on the conductive properties of SWNTs that is the opposite of that due to $NO_2$ exposure, and thus causes a decrease in SWNT conductance. The measured SWNT conductance following a TMA pulse exposure is seen in the plot to recover slightly due to desorption after each pulse, but it does not return to a constant baseline value as it did with $NO_2$ exposure. This results in an overall negative slope in the conductance/time profile, which may be due to an increase in contact resistance at the Mo electrodes caused by the reaction of TMA with surface hydroxyls.

Figure 3C:
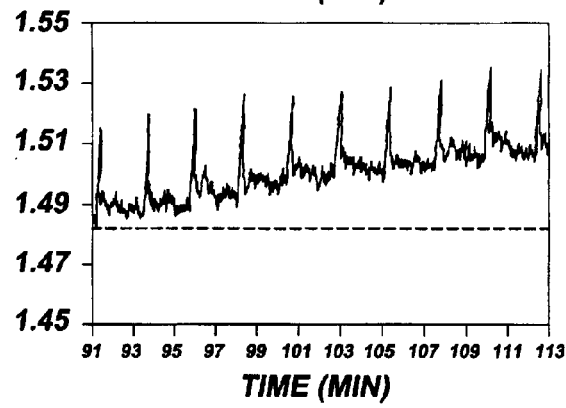
FIG. 3C is a plot of measured conductance of a SWNT as a function of time as ALD functionalization cycles of $NO_2$ and $Al(CH_3)_3$ dosing are carried out.
Figure 3D:
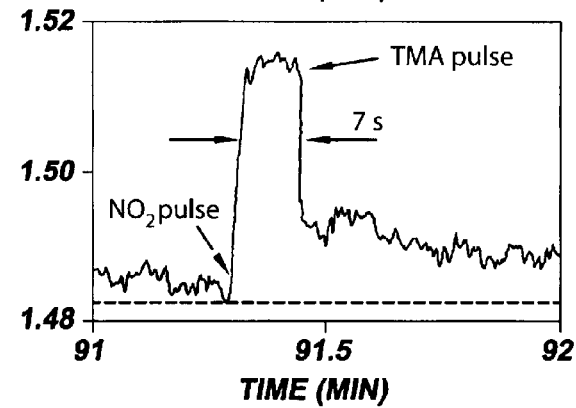
FIG. 3D is a plot of measured conductance of a SWNT as a function of time as one ALD functionalization cycle of $NO_2$ and $Al(CH_3)_3$ dosing is carried out.

The $NO_2$ dosing experiment of Example I was combined with the TMA pulsed dosing, so that each $NO_2$ pulse was followed by a TMA pulse. The conductance of a SWNT was measured during the dosing pulse sequence. FIG. 3C is a plot of the measured conductance during the pulsed dosing, and FIG. 3D is a plot of conductance for one pulse cycle of the sequence. Here it is found that each conductance increase caused by $NO_2$ is offset by a conductance decrease caused by the TMA. Recall that when $NO_2$ was dosed by itself, the conductance returned to a baseline value, and the average slope was zero. This was not the case when $NO_2$ dosing was followed by TMA exposure. Here the current rises stepwise with every $NO_2$-TMA cycle, and there is a net positive slope.

If $NO_2$ could freely desorb from the SWNT surface, one would expect the slope of FIG. 3C to be zero as in the plot of FIG. 3A, or even negative because of the presence of TMA. The positive net slope produced by the $NO_2$-TMA pulsed treatment therefore indicates that TMA reacts with $NO_2$ to effectively inhibit desorption of the $NO_2$, resulting in a more stable complex on the SWNT surface.

Example III

Functionalization Layer Thickness Control by ALD Cycle Number

Figure 4A:
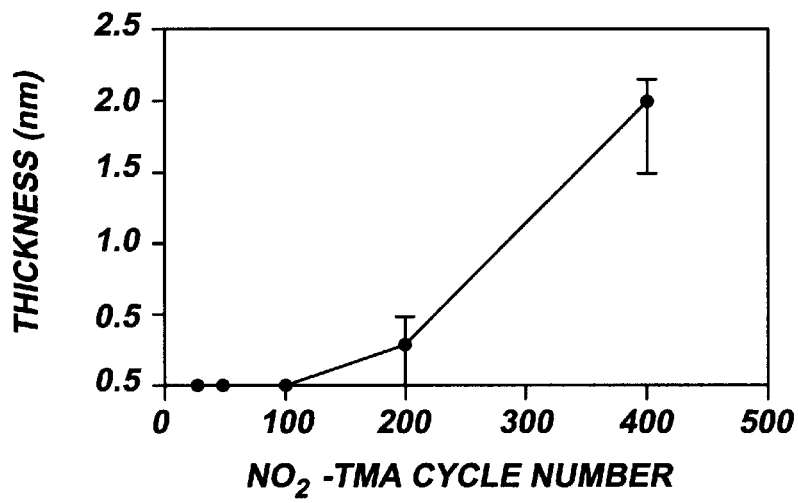
FIG. 4A is a plot of measured functionalization layer thickness as a function of number of ALD functionalization cycles of $NO_2$ and $Al(CH_3)_3$ dosing.

SWNTs were synthesized as in Example I. The SWNTs were subjected to various $NO_2$-TMA functionalization processes, with the number of $NO_2$-TMA functionalization cycles adjusted to elucidate the nature of the resulting functionalization layer. For each process, a vacuum pressure of about 300 mTorr, under the continuous flow of argon at a flow rate of about 50 sccm, at a temperature of about 25° C., was employed. One functionalization cycle consisted of a 30 mL $NO_2$ vapor dose at about 960 Torr followed by a 2 min purge with argon, then a 6 mL TMA vapor dose at about 10 Torr, followed by a 2 min purge. FIG. 4A is a plot of the thickness of the functionalization layer as a function of the number of $NO_2$-TMA cycles.

As shown in the plot, the thickness of the functionalization layer remained constant at about one monolayer for up to about 100 $NO_2$-TMA cycles. This preserved functionalization layer thickness within the first 100 $NO_2$-TMA cycles confirms that the $NO_2$-TMA technique forms a self-terminating monolayer on the SWNT surface. When more than 100 $NO_2$-TMA cycles were carried out, the functionalization layer increased in thickness. Imperfections in the methyl surface eventually led to addition of more material beyond the monolayer, which begins around 200 cycles, and is prevalent by 400 cycles. This breakdown of the self-limiting behavior is found to cause a porous, nonuniform multi-layer to form on the SWNT surface. Because fine control of coating thickness and control of coating uniformity is a desired goal for many applications, it therefore can be preferred to use less than 100 functionalization cycles.

Inertness of the surface methyl groups to chemical reaction with $NO_2$ may be the reason that the functionalization layer is self-limited at a monolayer. Only when both water and TMA are added does a stabilization layer grow around the functionalization layer. Water molecules are likely to cleave the methyl groups from their aluminum centers, leaving hydroxyl groups (—OH) in their place and methane ($CH_4$) as a gaseous byproduct. This newly hydroxylated surface is in turn susceptible to ALD reactions through similar cleavage mechanisms.

Example IV

Functionalization Layer Thickness Control by $NO_2$ Exposure

Figure 4B:
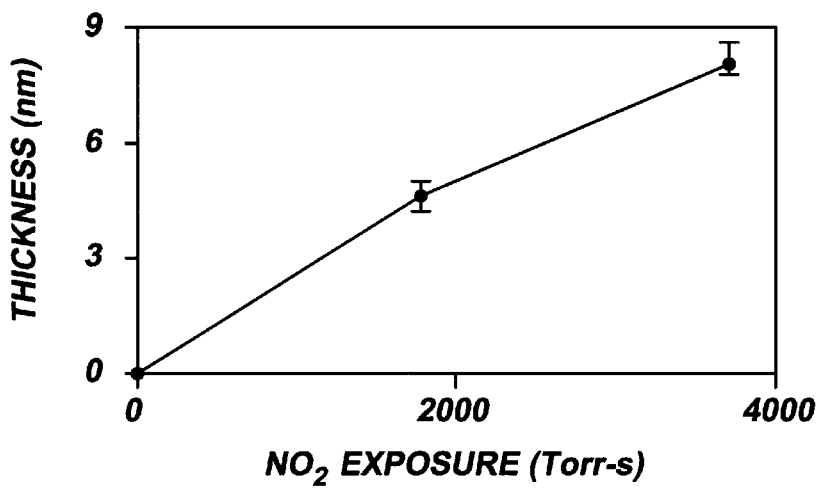
FIG. 4B is a plot of measured functionalization layer thickness as a function of $NO_2$ dosing in an ALD functionalization cycle of $NO_2$ and $Al(CH_3)_3$ dosing.

SWNTs were synthesized as in Example I. The SWNTs were then subjected to the functionalization process of Example III with the duration of the $NO_2$ dosing step in each $NO_2$-TMA functionalization cycles adjusted to elucidate the nature of the functionalization layer. FIG. 4B is a plot of functionalization layer thickness as a function of $NO_2$ dosing.

It is here shown that the thickness of the functionalization layer is directly proportional to the $NO_2$ exposure, i.e., the thickness depends on the number of collisions that $NO_2$ gas molecules can make with the functionalization layer before they are purged. More collisions increase the chance of $NO_2$ molecules finding and adsorbing onto imperfections in the layer. $NO_2$ adsorbed in this way can then act as an adsorption site for incoming TMA. As this happens over many cycles, a multi-layer with appreciable thickness can be produced. Based on this evidence, it can be preferred to optimize the functionalization procedure of the invention by using low exposure, flow-through style dosing, and a relatively low number of cycles, e.g., less than 100, as explained above.

Example V $Al_2O_3$ Deposition on Functionalized SWNTs

A 200 nm-thick silicon nitride membrane was fabricated and FIB milling was employed to form a through-hole extending through the membrane. Co nanotube catalyst regions were formed by ALD of a Co layer on the nitride membrane surface and lift-off patterning of the layer, and then the SWNT growth of Example I was carried out with a 5 min growth time. This was sufficient to grow a relatively high yield of tubes that were long enough to completely traverse the patterned FIB holes in the membrane. During the growth, SWNTs grew across the holes, making their suspended sections ideal for TEM analysis.

The suspended SWNTs were functionalized in accordance with the invention by exposure to 50 $NO_2$-TMA ALD functionalization cycles in a vacuum pressure of about 300 mTorr, under the continuous flow of argon at a flow rate of about 50 sccm at a temperature of about 25° C. One cycle consisted of a 30 mL $NO_2$ vapor dose at about 960 Torr followed by a 2 min purge with argon, then a 6 mL TMA vapor dose at about 10 Torr, followed by a 2 min purge.

After the 50 functionalization cycles were complete, 5 cycles of a stabilization process were carried out. Here the stabilization layer was provided as high-κ $Al_2O_3$ deposited by ALD at 25° C. One ALD $Al_2O_3$ stabilization cycle consisted of a 6 mL does of TMA at 10 Torr, followed by a 2 min purge with argon, then water vapor at about 24 Torr pulsed for 0.2 s in a vacuum at about 300 mTorr, followed by a 5 minute purge with argon. A layer of about 0.5 nm in thickness was formed.

The temperature was then increased to 225° C. for additional $Al_2O_3$ deposition on the functionalization and stabilization layers. This $Al_2O_3$ deposition was carried by alternating doses of TMA vapor, at a flow of about 6 mL and a pressure of about 10 Torr, and water vapor, at a pressure of about 24 Torr, with the valve open for about 0.2 s. Between doses, 30 to 60 second purges were carried out. The base pressure during deposition was 300 mTorr, and there was a constant flow of argon of about 50 sccm through the reactor during this process.

Each ALD cycle of $Al_2O_3$ was found to have added about 0.1 nm to the radius of the coating on the SWNT. 20 ALD cycles gave a coating with 2 nm radial thickness. 100 ALD cycles gave a coating with a radial thickness of 10 nm. The resulting ALD coating around the SWNTs was found to be uniform and continuous. This experimentally verifies that deposition of a selected insulating material on a stabilized functionalization layer exhibits little if any inhibition or delay in nucleation of the ALD growth.

Example VI

Prevention Against Schottky Barrier Modulation

Figure 5A:
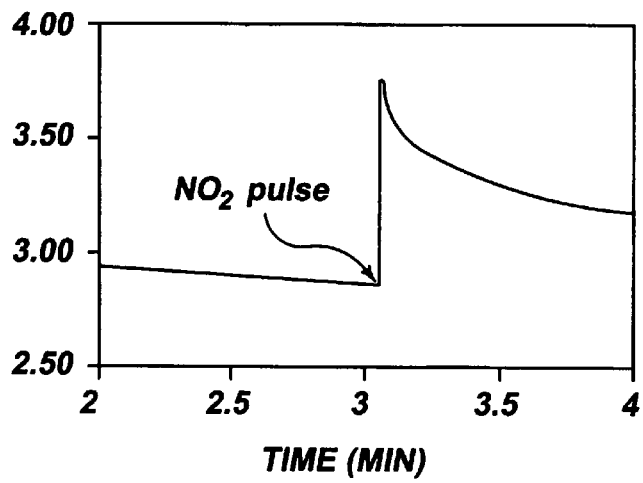
FIG. 5A is a plot of measured conductance of a SWNT as a function of time as one pulse of $NO_2$ dosing is adsorbed and desorbed from the surface of the SWNT where the SWNT Schottky barriers with electrodes at the SWNT ends have not been passivated.

SWNTs were synthesized as in Example I. The SWNTs were then exposed to pulsed $NO_2$ doses. FIG. 5A is a plot of the measured conductance of a SWNT as a function of time as one $NO_2$ dose pulse was applied to the bare SWNT. The exposure caused a conductance increase of $\sim 10^{-5}$ A/V, followed by a decrease due to desorption, as explained in Example I.

After a 12 hour purge, the SWNT was coated with 10 nm of ALD $Al_2O_3$. One ALD $Al_2O_3$ deposition cycle consisted of a 6 mL does of TMA at 10 Torr, followed by a 2 min purge with argon, then water vapor at about 24 Torr pulsed for 0.2 s in a vacuum at about 300 mTorr, followed by a 5 minute purge with argon. The process was carried at room temperature. This ALD deposition did not coat the SWNTs, given the inert nature of the bare SWNT surface to ALD deposition, but did coat the Mo/SWNT junctions, passivating the Schottky barriers at the point between each end of a SWNT and the electrical contact on the surface. Without a functionalization layer, the SWNTs were effectively self-masked from deposition of the ALD coating.

Figure 5B:
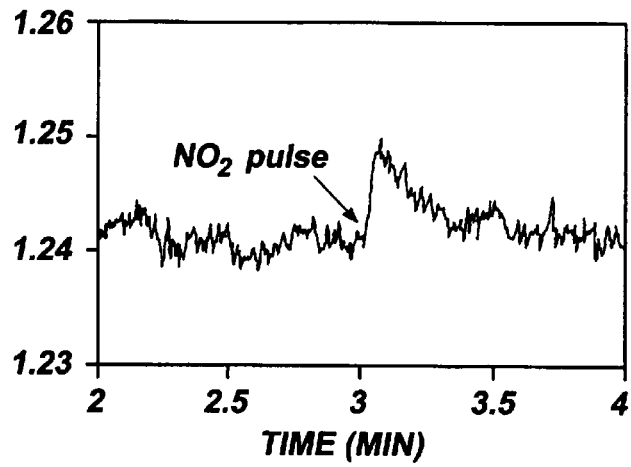
FIG. 5B is a plot of measured conductance of a SWNT as a function of time as one pulse of $NO_2$ dosing is adsorbed and desorbed from the surface of the SWNT, where the SWNT Schottky barriers with electrodes at the SWNT ends have been passivated.

This experiment isolated SWNT conduction changes caused by charge-transfer doping of the nanotubes from conduction changes caused by modulation of the Schottky barrier at the contacts between the SWNTs and the Mo electrodes. FIG. 5B is a plot of measured conductance as a function of time as $NO_2$ dose pulses were applied to the SWNT after the Mo/SWNT junctions were passivated. The conductance increase is now only about $10^{-7}$ A/V, two orders of magnitude smaller than it was for SWNTs having exposed Schottky barriers. From this it can be concluded that most of the conductance change caused by $NO_2$ occurs through modulation of the Schottky barriers. Accordingly, this further confirms that the $NO_2$ layer does not significantly perturb the electrical properties of the nanotube.

Figure 5C:
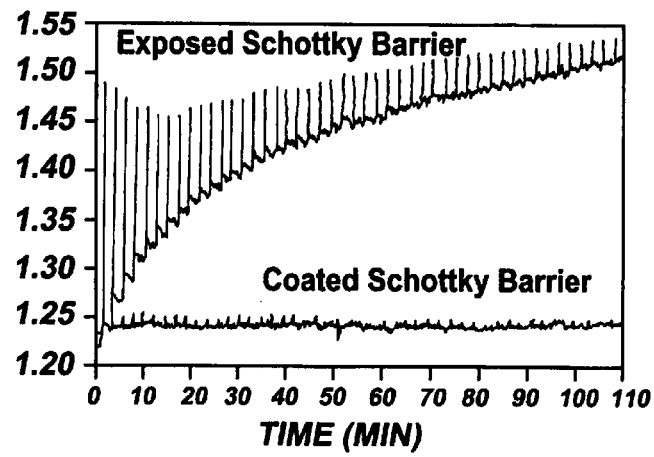
FIG. 5C is a plot of measured SWNT conductance as a function of time as multiple $NO_2$ pulse dosing is carried out, indicating the conductance for a SWNT having Schottky barriers with electrodes at the SWNT ends that have not been passivated and are exposed, and for a SWNT having Schottky barriers with electrodes at the SWNT ends that have been passivated and are coated.

Further illustration of this condition was experimentally observed during a $NO_2$-TMA functionalization treatment. One suspended SWNT with exposed Schottky barriers and one suspended SWNT having Schottky barriers passivated by the $Al_2O_3$ deposition given above were both exposed to 50 $NO_2$-TMA ALD functionalization cycles under the process conditions of Example III. FIG. 5C is a plot of conductance as a function of time during the 50 cycle functionalization process for each of the two SWNT conditions.

From the plotted data it is seen that the conductance of the SWNT having uncoated Mo/SWNT contacts changed significantly while the conductance of the SWNT having coated Schottky barriers was relatively constant. These results show that Schottky barrier modulation is the dominant mechanism causing the conductance increase observed during functionalization. This is reasonable considering that $NO_2$ exposure is expected to alter metal work functions. Furthermore, this demonstrates that the functionalization technique of the invention can be used without dramatically changing the conductance of a nanotube if the Schottky barriers of the nanotube are adequately protected.

Example VII

Fabrication of Core-Shell Nanotube Structures

Suspended SWNTs having a 10 nm-thick $Al_2O_3$ coating over functionalization and stabilization layers were fabricated as in Example VI. The $Al_2O_3$-coated SWNTs were then coated with a selected metal layer. One particularly convenient metal deposition technique that can be employed in accordance with the invention is the ALD coating process described in U.S. Patent Application Publication No. US2006/0141155, published Jun. 29, 2006, entitled, "Atomic Layer Deposition Using Metal Amidinates," by Gordon et al., the entirety of which is hereby incorporated by reference.

Metals including copper, cobalt, nickel, iron, ruthenium, manganese, chromium, vanadium, niobium, tantalum, titanium, lanthanum, rhodium, or other suitable metal layer can be formed by ALD techniques. For example, rhodium deposition by ALD can be carried out in accordance with the invention as described by Aaltonen et al., "ALD of Rhodium Thin Films from $Rh(acac)_3$ and Oxygen," *Electrochemical and Solid-State Letts.*, V. 8, N. 8, pp. C99-C101, 2005, the entirety of which is hereby incorporated by reference. Metal coating by evaporation, chemical vapor deposition, or other deposition technique can also be employed in accordance with the invention to deposit gold, silver, palladium, or another selected metal. Other suitable electrically conducting materials, such as tungsten nitride, can also be employed. One example technique in accordance with the invention for depositing an electrically conducting material such as tungsten nitride by ALD is described by Becker et al., in "Highly Conformal Thin Films of Tungsten Nitride Prepared by Atomic Layer Deposition from a Novel Precursor," *Chem. Mater.*, N. 15, pp. 2969-2976, 2003, the entirety of which is hereby incorporated by reference.

Whatever deposition technique is employed, the metal deposition results in an insulator-metal core-shell structure around the SWNT. The functionalization process of the invention enables this core-shell structure to be formed with SWNTs, overcoming the inherent inertness of SWNTs to conformal layer deposition. The functionalization process of the invention also enables this core-shell structure to be produced with ALD processes that can control the thickness of the shell structure at the nanometer scale and that can reliably and reproducibly provide conformal and uniform shell layers.

Example VIII

Hydrophilic Nanotube Coating

A carbon nanotube functionalized in accordance with the invention as in the examples above is coated with a selected one or more materials to render the carbon nanotube hydrophilic and therefore amenable to suspension in a polar solvent such as water or alcohol. Suspensions of such hydrophilic nanotubes can then be employed, e.g., in medical applications. It is recognized that hydrophilic carbon nanotubes are less toxic than uncoated nanotubes and therefore are safer for medical applications. The nanotube hydrophilic conditions render the nanotube well-suited for a wide range of applications beyond medical applications in which it can be desirable to process nanotubes in a polar solvent such as water.

A hydrophilic layer such as a metal oxide or a silicon dioxide layer is deposited by a selected technique, e.g., ALD, on a functionalized carbon nanotube for rendering the nanotube hydrophilic. One example ALD technique in accordance with the invention for deposition of silicon dioxide or any in a range of metal oxides is described in U.S. Pat. No. 6,969,539, issued Nov. 29, 2005, by Gordon et al., entitled "Vapor Deposition of Metal Oxides, Silicates and Phosphates, and Silicon Dioxide," the entirety of which is hereby incorporated by reference. Chemical vapor deposition (CVD), including low pressure chemical vapor deposition (LPCVD), plasma enhanced CVD (PECVD), physical vapor deposition (PVD), or other selected technique can be employed to form the oxide layer. Additionally, a metal layer provided on a functionalization nanotube can itself be oxidized to form an oxide layer.

Example IX

Fabrication of Coaxial Nanotubular Structures

Carbon nanotubes are synthesized and coated with functionalization and stabilization layers as in Example III. The coated carbon nanotubes are then coaxially coated with one more layers of material that preferably are oxidation resistant, e.g., with the $Al_2O_3$ material as in Example VI. The coated carbon nanotube structure is then separated from the surface or surfaces from which it was synthesized, to produce free carbon nanotubes and to expose the nanotube ends. In one example of such a technique, the nanotube structure and support arrangement is suspended in a selected liquid medium, e.g., alcohol, and ultrasonicated to break the ends of nanotubes from the support structure. This releases the coated nanotubes from the support structure and suspends the nanotubes in the medium. The liquid medium is then evaporated and the nanotubes are dried.

The carbon nanotube itself is then removed from each coated nanotube structure by any suitable method, e.g., by oxidation. When heated in an oxidizing atmosphere, such as air or oxygen, to a sufficiently high temperature, such as over about 600° C., carbon nanotubes oxidize and can be completely annihilated by oxidation at, e.g., 700° C.-800° C. for 2 hours. Annihilation of the carbon nanotube from the coating structure produces a hollow center surrounded by coaxial layers of the material that was deposited on the nanotube. As a result, a nanotubular structure having an inner diameter that corresponds to the diameter of the original carbon nanotube is formed.

The original carbon nanotube thereby operates as a removable scaffold, and its removal produces precisely-controlled hollow nanotubes of the selected deposited material or materials. The uniform, conformal nature of material deposition that is enabled by the functionalization process of the invention allows for this hollow nanotube production process. By employing an ALD technique to form the coaxial material layers, the diameters of the resulting tubes to be produced by the deposited material can be set at any desired value because growth per ALD cycle is highly reproducible. By changing reactants after a selected number of ALD cycles, coaxial core-shell structures can also be constructed. Any number of layer arrangements can be employed in formation of such a structure, providing, e.g., conducting, insulating, and semiconducting layer arrangements for use in electronic and sensing applications.

In one example, a hollow nanotubular structure thusly produced can be employed as a hollow gas sensing structure. It is recognized that the electrical resistance of semiconducting metal oxides, such as tin oxide and cobalt oxide, is sensitive to various gases. A metal oxide nanotubular structure therefore enables the production of a highly sensitive gas sensor.

For many applications, the hollow nanotubular structures must be placed between electrodes or other device elements for making electrical connection in a circuit or other system. Such an arrangement can be accomplished by, e.g., suspending the nanotubular structures in a solvent and spinning the solution onto a surface having electrodes provided thereon. Alternatively, lithography can be used to form electrodes at selected locations once the nanotubular structures are positioned on a selected surface.

Considering this arrangement for a hollow gas sensing structure, the nanotubular structure can be, e.g., tin oxide or cobalt oxide. The conductance of the nanotube can be monitored by flowing current through the nanotube. When the nanotubular gas sensor is exposed to gas, the energy levels in the nanotube are altered, causing a change in the nanotube conductance. A transistor configuration is not required for a gas sensing device as no gate is necessary.

A hollow nanotubular structure can also be employed as a nanowaveguide with appropriate core and cladding material selection. One example of such materials are described by Govyadinov et al., "Gain-Assisted Slow to Superluminal Group Velocity Manipulation in Nanowaveguides," *Phys. Rev. Lett.*, V. 97, p, 223902++.

Example X

Nanotube-Based Dielectric Etch Mask

The formation of nanotubular structures enables a wide range of additional applications and processes. In one such example process, an etch mask is formed of nanotubular structures. A material that is substantially impervious, or at least highly resistant to, a particular etch species is layered on a functionalized carbon nanotube for producing an etch mask material. In this process, a carbon nanotube surface is first functionalized and stabilized as in Example III above. Then a selected etch masking material is deposited on the functionalized nanotube to form a uniform coaxial layer around the nanotube surface.

If desired for a given application, the carbon nanotube is then removed from the structure, following the techniques of Example IX above, to produce a nanotubular structure of the masking material. Alternatively, the carbon nanotube is retained in the nanotubular structure. A liquid suspension of masking material nanotubes is then produced by placing the tubes in a liquid medium such as water. The liquid suspension of masking material nanotubes forms a liquid nanotube resist that can be spin-coated onto a surface in the conventional manner. Once spin-coated on a surface, various etch process techniques can be carried out employing the nanotube resist layer as a masking layer. After completing the etching, the nanotube resist layer can be removed by a suitable technique, e.g., wet etching, dry etching, or chemo-mechanical polishing.

In one example of this nanotube masking process, nanotube coating materials are selected specifically to enable masked etching of a dielectric material on a substrate. Given a fluorine-based plasma recipe for dielectric etching, as is conventional, then a material such as $Sc_2O_3$, $Y_2O_3$, $LaAlO_3$, $MgO$, $GdScO_3$, or other selected material can be employed as the nanotubular mask material to be coated on a nanotube. One suitable deposition process for $Sc_2O_3$ coating in accordance with the invention is described in "ALD of Scandium Oxide from Scandium tris(N,N-diisopropylacetamidinate) [Sc(amd)$_3$] and Water," by Gordon et al., *Electrochemical and*

Solid-State Letters, V. 9 N. 6, pp. F45-F48, 2006, the entirety of which is hereby incorporated by reference. U.S. Patent Application Publication No. 2006/0141155 cited above also describes suitable deposition techniques. One suitable deposition process for $GdScO_3$ coating in accordance with the invention is described by Kim et al., in "Atomic layer deposition of gadolinium scandate films with high dielectric constant and low leakage current," *Appl. Phys. Lett.*, V. 89, pp. 133512-1-133512-3, 2006, the entirety of which is hereby incorporated by reference. One suitable deposition process for $La_2O_3$ coating in accordance with the invention is described by Lim et al., in "Atomic layer deposition of lanthanum aluminum oxide nano-laminates for electrical applications," *Appl. Phys. Lett.*, V. 84, N. 20, pp. 3957-3959, May 2004, the entirety of which is hereby incorporated by reference. Deposition of a layer of one of the selected materials having a thickness of, e.g., about 5 nm-10 nm, is carried out by ALD or other suitable technique on functionalized carbon nanotubes.

The carbon nanotubes can then be annihilated by the oxidation process of Example IX, resulting in nanotubular structures of the selected oxide material, or can be retained in the structures if desired. A suspension of the nanotubular structures can then be formed with a selected liquid medium. This liquid suspension is spin-coated on a dielectric layer to be etched by a fluorine-based plasma. Scandium oxide etches 100 to 1000 times slower than silicon dioxide and therefore is an excellent etch mask for silicon dioxide etch processes.

In one example etch process provided by the invention, the oxide nanotube etch mask is spin-coated on a substrate to provide a blanket masking layer over a dielectric layer on the substrate, for which a low-κ characteristic is desired. Such can be the case for, e.g., intermetal dielectric layers where a dielectric constant of less than about 4 is desired. The spin-coated masking layer includes oxide nanotubes at random orientations distributed across the dielectric layer surface.

With the masking layer in place, a fluorine-based plasma etch process is carried out: 200 W of microwave power, 50V of DC bias, 2.0 sccm $O_2$ flow rate, 40.0 sccm $CF_4$ flow rate, and a pressure of 20.0 mTorr. The random pattern of the layer of masking oxide nanotubes shields the underlying dielectric layer in a corresponding fashion such that the plasma etch forms vertical walls, through the layer, of the protected material regions, that are oriented in random directions across the layer. The high-aspect ratio pattern of oxide nanotube distribution in the masking layer is therefore replicated in the underlying etched dielectric layer by the plasma etch. This etch process results in a porous dielectric layer having a commensurate low-κ characteristic. The dielectric constant of the dielectric layer can be prespecified, e.g., as less than about 4, and tailored by correspondingly selecting the density of nanotubular structures included in the spin-coated masking layer. It is to be recognized that some empirical analysis can be required to correlate the oxide nanotube density of a masking layer with a prescribed dielectric constant for a dielectric layer to be etched.

The walls in the dielectric layer formed by the plasma etch process are considerably more robust than cylindrical pillars of comparable dimensions made from nanoparticle masks. As a result, this method enables chemomechanical polishing (CMP) to be carried out on solid dielectric layers that have high mechanical strength, rather than on conventional porous dielectrics that have low strength. Only after the CMP of a top layer is complete is the dielectric etched. In addition, the random orientation of nanotubes produces randomly oriented walls of the remaining dielectric layer enabling a high shear strength in any direction.

In a typical interconnect structure with trenches and vias underneath, the etch depth may conveniently extend at least through the thickness corresponding to the trenches, because the capacitance between the trenches causes more significant delays in signal propagation than the dielectric remaining between the vias. Once the porous etch method is complete, the etch mask can be removed by any convenient cleaning process, such as blowing with a gas or a spray of dry ice pellets, or by CMP. Any nanotubes that escape the polishing step to remain on the dielectric layer are harmless in that they are insulators themselves and therefore cannot cause a short circuit between metal layers.

Example XI

Fabrication of a Coaxially-Gated Ballistic SWNT Field Effect Transistor

A SWNT is synthesized in a configuration that is suitable for coaxial coating, such as the synthesis process of Example I. The surface of the synthesized, suspended SWNT is then functionalized, stabilized, and coaxially coated with an insulator, such as $Al_2O_3$, and then a selected metal, such as WN, as in Example VII. The coaxial, suspended core-shell SWNT structure is then coated with a suitable photoresist and the photoresist is exposed only at the ends of the SWNT structure with UV light, electrons, or other suitable resist exposure species. The resist is then developed, exposing only the ends of the SWNT core-shell structure.

The metal and insulator materials are then etched off of the surface of the SWNT at the two ends of the nanotube, e.g., by conventional metal and oxide wet or dry etches, to expose the surface of the nanotube at its ends. Electrical contact pads and electrical connections to the SWNT surface then are formed. The contact pads and electrical connections are produced by evaporation of Pd, Rh or other selected metal that does not form a Schottky barrier with the nanotube onto this structure, making electrical contact between with the exposed SWNT ends and contact pads. A photoresist lift-off technique is employed to pattern the metal contact material. The remaining resist is removed with conventional lift-off procedures, producing a SWNT that is coaxially passivated with an insulator, coaxially gated with a metal, and electrically accessible through the metal contacts at the ends of the nanotube. This structure provides a SWNT field effect transistor geometry that is very precisely defined and fabricated by the ALD processes of the invention. With palladium or rhodium, or other similar metal as the electrically conducting contact material, the structure is characterized as a ballistic field effect transistor.

Example XII

Coaxially-Gated Schottky Barrier-Modulated SWNT Field Effect Transistor

Field effect transistor fabrication with a suspended SWNT is carried out as in Example XI. But instead of Pd or Rh, a metal that produces a Schottky barrier at each metal/SWNT junction, such at Mo or Pt, is employed to make contact to the ends of the nanotube. The result is a SWNT field-effect transistor that is modulated by carrier transport over and through the Schottky barriers.

Example XIII

Bulk-Modulated SWNT Field Effect Transistor

Figure 6A:
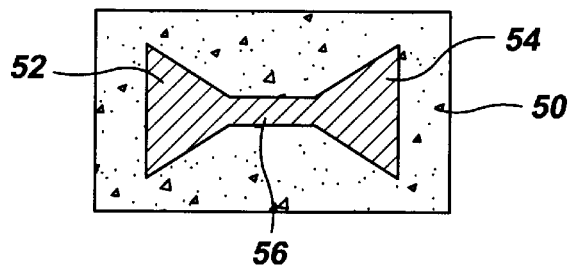
FIGS. 6A-6I are schematic views of process steps in the fabrication of a doubly-suspended carbon nanotube field effect transistor in accordance with the invention.

Referring to FIG. 6A (not to scale), a supporting substrate 50, e.g., a quartz chip, or other suitable substrate is provided.

Electrically conducting contact pads 52, 54, of, e.g., 50 nm-thick Mo and 50 nm-thick Ti layers, are patterned on the substrate to provide transistor source and drain connections. A metal line 56 of Mo and Ti is provided between the source and drain pads 52, 54. The source and drain pads and metal line are formed by conventional lift-off.

Figure 6B:
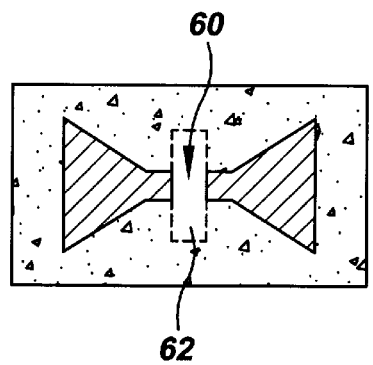
Figure 6C:
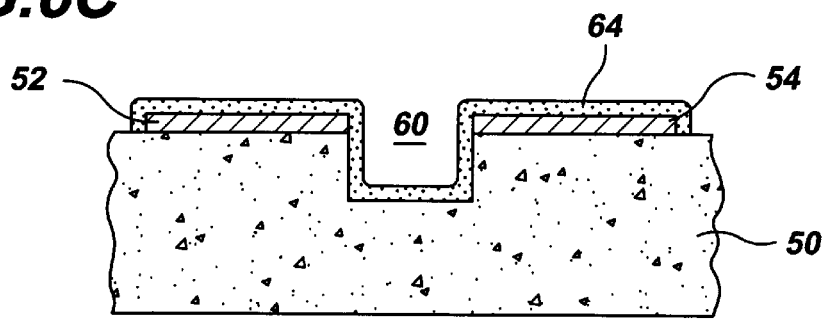

Referring to FIG. 6B, then, as in Example I, a trench 62 of 1 μm in width and 0.5 μm in depth is cut, by focused ion beam or other suitable method, into the substrate 50, across the metal line 56 between the source and drain pads. This forms a gap 60 between the source and drain pads and self-aligns the edges of the source and drain pads with the edge of the trench 62. As shown in FIG. 6C, 0.5 nm-thick layer 64 of, e.g., $Al_2O_3$ or other selected material is then deposited by ALD on the electrode surfaces to prevent alloying between the molybdenum and the nanotube catalyst metal.

Figure 6D:
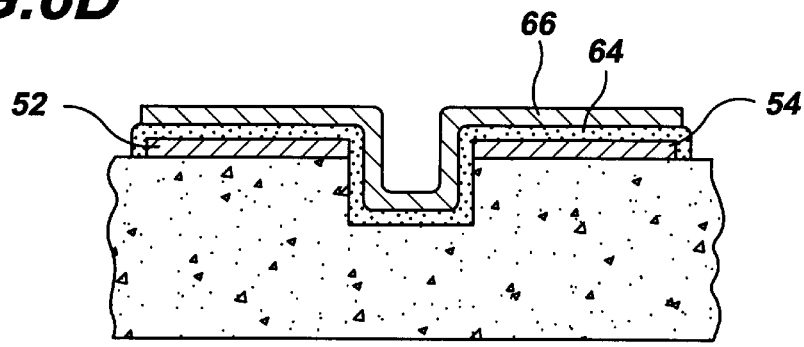
Figure 6E:
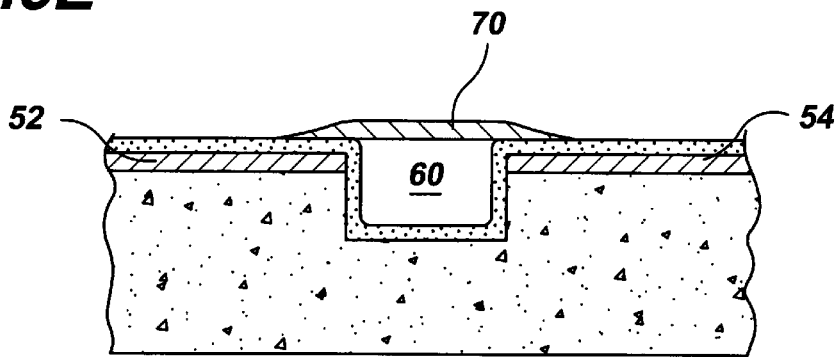

Referring to FIG. 6D, then a catalyst layer 66 of Co of about 0.3 nm in thickness is deposited and patterned by liftoff on the electrode surfaces to form catalyst regions. With the catalyst in place, then as in Example I above, one or more SWNTs 70 are synthesized across the trench 60 between source and drain, as shown in FIG. 6E. The catalyst agglomerates at the synthesis temperature and is effectively removed by this process. For clarity only a single synthesized nanotube is shown in the figures.

Figure 6F:
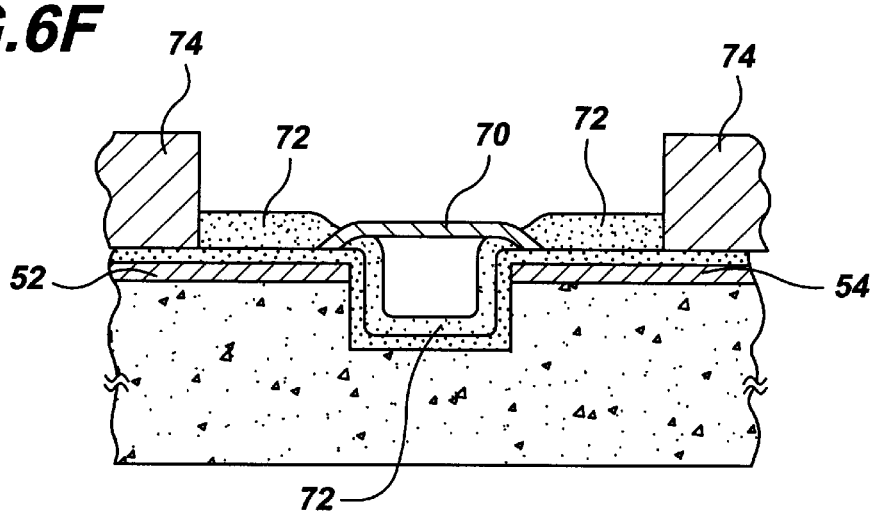

Turning to FIG. 6F, a portion of the source and drain electrodes 52, 54 far from the suspended SWNT are masked with glass slide 74 or similar smooth surface, or with a photolithography resist. The structure is then coated with a layer 72 of $Al_2O_3$ or other suitable material. This insulating layer 72 coats the pre-patterned metal electrodes, except the region underneath the masks 74. The insulating layer does not coat the suspended section of the SWNT because as-synthesized, the nanotube is inert to vapor deposition processes such as the ALD deposition process. The nanotube is thereby self-masked from the insulator deposition process. The insulating layer does, however, coat the junction at the ends of the SWNT and the source and drain pads because the dielectric layer can grow up from the substrate surface around the edges of the nanotube. This selective deposition can be carried out with any selected vapor process, including, e.g., low-temperature CVD processes, to which a SWNT is chemically inert.

The selective nature of the deposition during this insulating layer formation enables the precise definition of the nanotube gate length. Specifically, the thickness of the layer can be selected to define a chosen gate length. Given that the suspended nanotube length can be approximated as the width of the trench prior to the nanotube synthesis step, then the $Al_2O_3$ thickness can be correspondingly selected so that the extent of the nanotube surface that is left uncoated by this step defines the gate length. For example, given a 200 nm-wide trench, then a $Al_2O_3$ layer of 50 nm in thickness coats 50 nm at the edges of the trench, as shown in FIG. 6F, leaving an uncoated nanotube suspension length of 100 nm. This 100 nm nanotube length then defines the length of the gate.

Figure 6G:
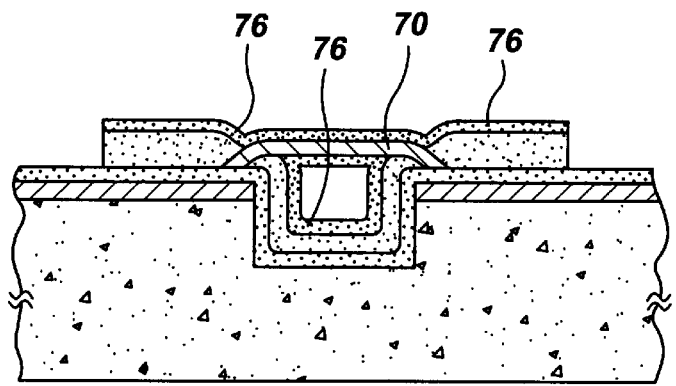

With this insulating layer in place, the SWNT is then functionalized as in Example III, with a functionalization and a stabilization layer formed on the nanotube surface. Referring to FIG. 6G, then a gate dielectric layer 76 of $Al_2O_3$ is deposited by ALD or other suitable technique. Here the deposition does coat the functionalized suspended nanotube to define a suspended gate the length of which is defined by this coating. The gate dielectric layer 76 is therefore preferably of a thickness selected as the coaxial gate oxide thickness for the field effect transistor. For many applications, a gate oxide thickness of about 5 nm can be preferable. Thicknesses less than about 5 nm can enable electronic tunneling phenomena, and thicknesses greater than about 5 nm can result in a loss of capacitive coupling with the nanotube gate.

Figure 6H:
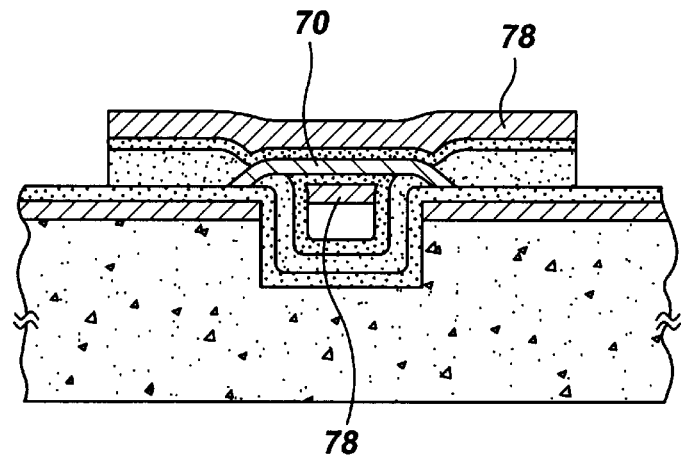
Figure 6I:
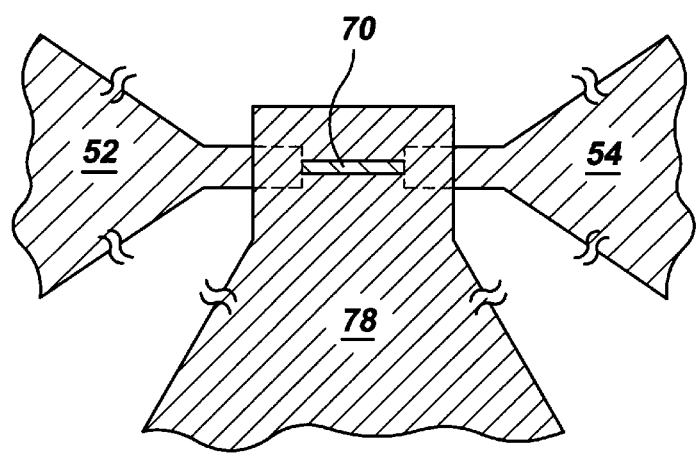

Referring to FIGS. 6H-6I, a coaxial metal gate layer 78 of WN, TiN, Cu, Ru, or other material is then deposited and patterned by the ALD techniques of the examples above, and with lift-off over the SWNT length. FIG. 6I is a schematic planar view, not to scale, indicating the geometry of the gate layer 78 across the length of the nanotube 70 and overlapping the ends of the source and drain connections 52, 54 with the nanotube. The thickness of the gate metal is preferably sufficiently large to produce a sheet resistance that is sufficiently small for the selected device geometry. ALD of WN is a preferred gate material with a thickness greater than about 20 nm.

With this configuration, the thickness of the insulating layer at the junction of the SWNT and the source and drain electrical connections is greater than the thickness of the gate dielectric encasing the functionalized length of the SWNT. As explained above, this results from the insulating layer deposition conditions under which the unfunctionalized nanotube is inert to the deposition, and precisely defines the length of the nanotube that operates as the gate. With this arrangement, the electric field generated by application of a voltage to the gate electrode has a greater effect along the thinly-coated SWNT length than at the thickly-coated SWNT/metal junctions at the ends of the nanotube. Given that the insulating layer at the SWNT/metal junctions is sufficiently thick, the effect of the field at those junctions is substantially negligible, and the SWNT field effect transistor is well-controlled for bulk-modulated operation.

Example XIV

Vertical SWNT Field Effect Transistor

Figure 7A:
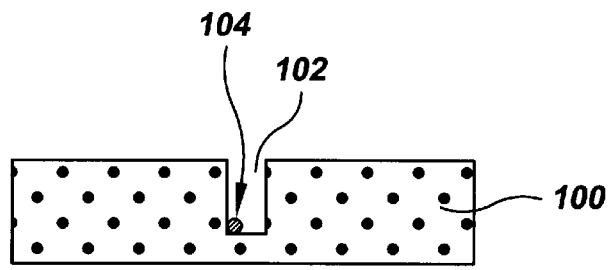
FIGS. 7A-7M are schematic side views of the process steps in the fabrication of a vertical carbon nanotube field effect transistor in accordance with the invention.

Referring to FIG. 7A (not to scale), a supporting substrate 100, e.g., a quartz chip, or other suitable substrate is provided. A trench 102 is formed in the substrate and a catalyst region 104 of Co is formed in the trench for growth of a nanotube in the trench. The metal catalyst region 104 is produced by evaporation and lift-off, as in the examples above. Alternatively, an isolated catalyst region 104 can be produced by blanket ALD of Co or other metal over the entire structure and polish of the metal off of the top surface of the substrate 100. A non-conformal refractory protective layer could instead be deposited over the catalyst on the surface of the substrate 100. For example, CVD or non-conformal (low-exposure) ALD $SiO_2$ may be used to cover and de-activate the catalyst on the top surface, where nanotubes are not desired.

Figure 7B:
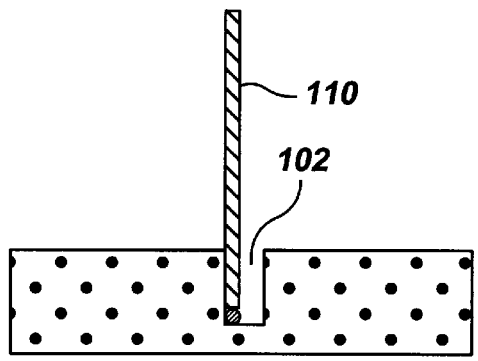
Figure 7C:
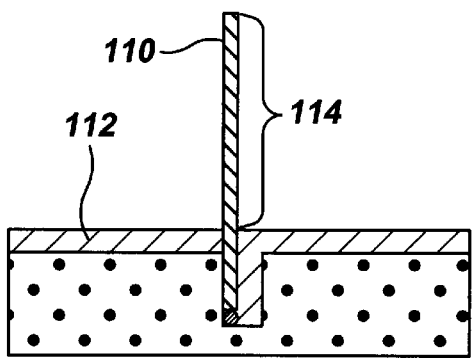

Referring to FIG. 7B, a carbon nanotube 110 is then grown following the synthesis of Example I vertically up and extending out of the trench 102. As shown in FIG. 7C, a layer 112 of metal is then deposited over the structure by ALD techniques in the manner given in the examples above for, e.g., Rh, Pd, and Ru. Because an ALD technique is employed for the metal deposition, the section 114 of the nanotube 110 that is freely standing above the substrate is not coated with the metal, given the inertness of the nanotube to the ALD process. The region of the nanotube in the trench 102 is coated with the metal because the metal grows from the walls of the trench and thus deposits around the nanotube in the trench. This forms the source (or drain) of the transistor with an electrical connection to the nanotube.

Figure 7D:
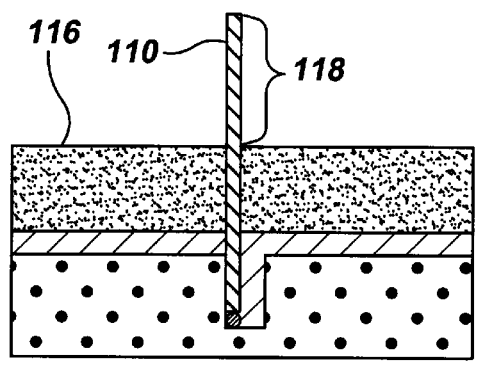

Then as shown in FIG. 7D an insulating layer 116 of silicon dioxide is deposited over the structure, by a vapor process such as a CVD process or the ALD techniques in the manner of the examples above. The selected vapor process preferably is one to which the SWNT is inert. With this condition, the section 118 of the nanotube 110 that is freely standing above the substrate is not coated with the insulating layer, given the inertness of the nanotube to the ALD or other selected vapor process.

Figure 7E:
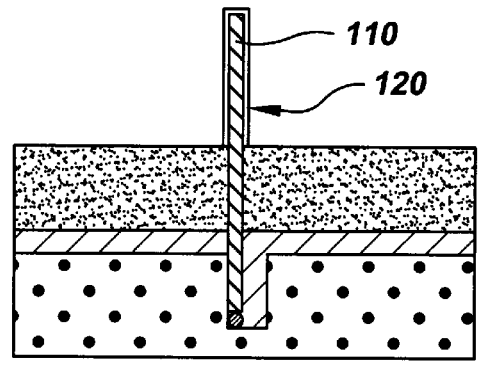
Figure 7F:
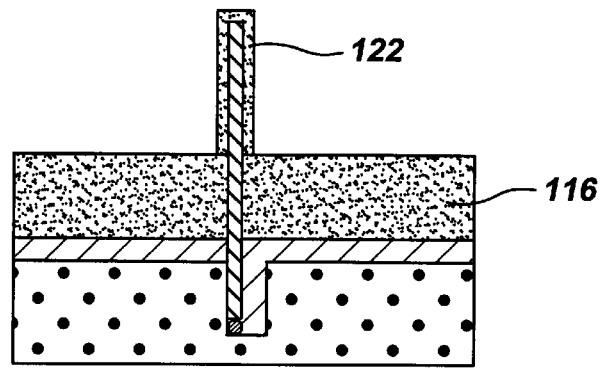
Figure 7G:
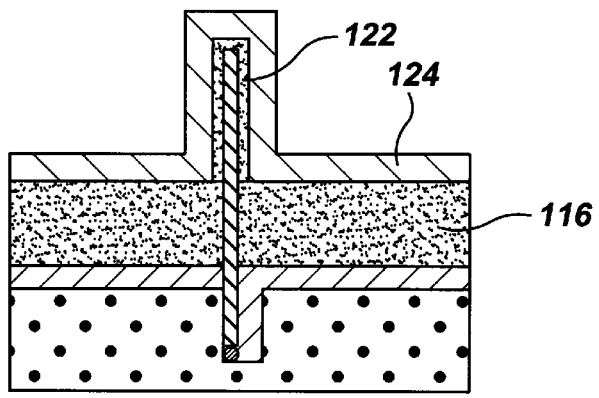

The surface 120 of the nanotube 110 is then functionalized and stabilized following the procedure of the examples above, as shown in FIG. 7E, and then as shown in FIG. 7F, a layer 122 of gate dielectric is deposited by ALD techniques over the structure. This adds to the thickness of the first insulating layer 116 and coats the functionalized carbon nanotube 110 as well. Referring to FIG. 7G, a layer 124 of gate metal is then deposited by ALD techniques in the manner of the examples above, coating the gate oxide 122 over the nanotube and coating the thicker oxide layer 116.

Figure 7H:
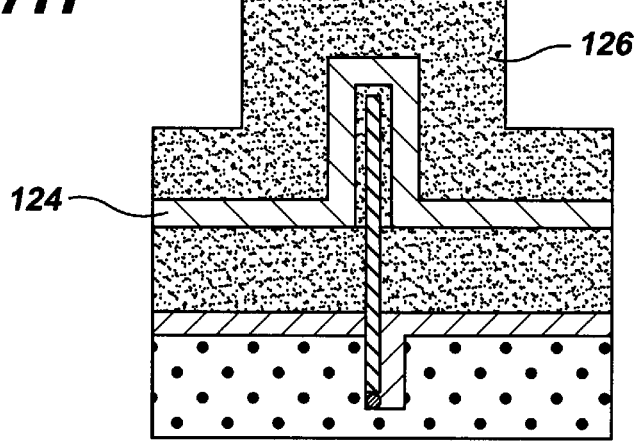
Figure 7I:
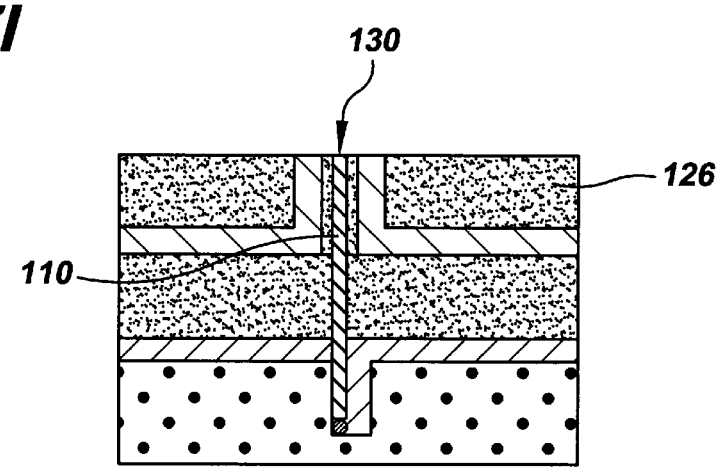
Figure 7J:
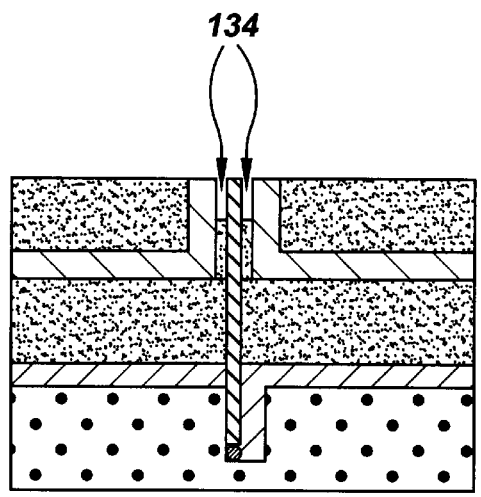

Referring to FIG. 7H, a layer 126 of silicon dioxide is then deposited by ALD in the manner of the examples above, covering the gate metal layer 124 for defining the connection to the drain region of the transistor. Then as shown in FIG. 7I, the top layers are polished off by CMP to expose the end 130 of the nanotube 110. Then as shown in FIG. 7J, the top region 134 of the gate insulator layer 122 is removed from around the nanotube. This is carried out by a chemically selective etch that removes the high-k oxide without dissolving the thicker insulator 126. For example, if the insulator 126 is SiO$_2$, then hydrochloric acid can be used to selectively remove a high-k insulator, such as lanthanum oxide.

Figure 7K:
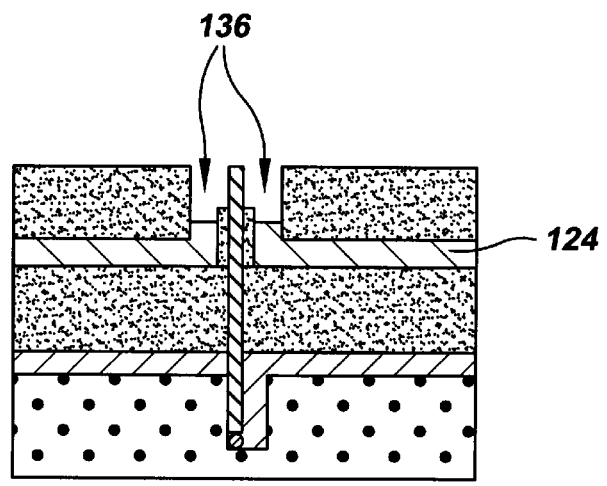
Figure 7L:
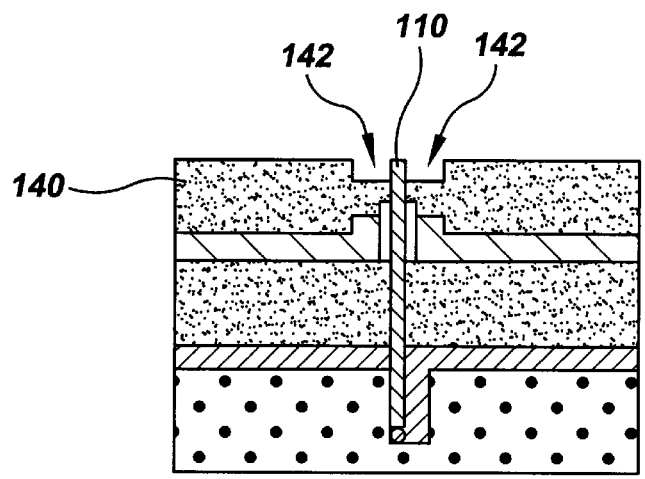
Figure 7M:
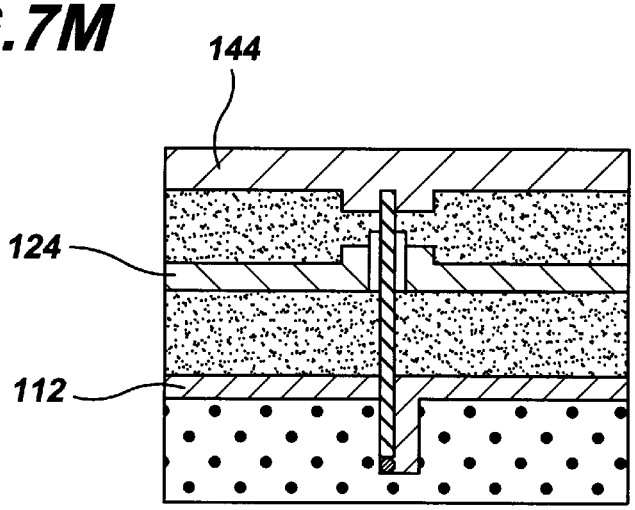

As shown in FIG. 7K, the top region 136 of the metal gate layer 124 is then selectively removed. For example, if tungsten nitride is used as a gate metal, then it is selectively removed by a hydrogen peroxide-ammonia etch solution. With this configuration, then, as shown in FIG. 7L, a layer 140 of silicon dioxide is deposited by ALD techniques on the structure. The silicon dioxide deposits around the nanotube 110 in a region 142 where other surfaces are available for deposition, but does not deposit on the exposed nanotube itself, due to the inert nature of the bare nanotube surface to the ALD process. Finally, as shown in FIG. 7M, a metal layer 144 is deposited by ALD to form the drain contact. With this deposition, source and drain contacts 112, 144, and a gate contact 124 are provided for connection along the nanotube transistor structure, and bulk modulation of the transistor along the nanotube length is achieved.

With the above description, the invention is described to provide a reliable technique for functionalizing carbon nanotubes to enable deposition of a wide range of materials on the nanotubes. By using optimized functionalization parameters, the nanotubes can be coated with high-κ dielectric material that is exceptionally thin, continuous, and radially isotropic. Changes in nanotube conductance caused by functionalization can be avoided by Schottky barrier passivation. Because the functionalization techniques of the invention avoid covalent modification, the optoelectronic and other properties of carbon nanotubes are preserved. A wide range of applications of the functionalized carbon nanotubes provided by the invention include coaxially-gated carbon nanotube-based devices, carbon nanotube-based sensors, and nanotubes of selected materials for, e.g., etch masking. It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for functionalizing a single-walled carbon nanotube surface, comprising:
exposing the single-walled carbon nanotube surface to at least a first vapor including a first vapor phase functionalization species that deposits on and non-covalently bonds to the single-walled carbon nanotube surface from the vapor phase and a second vapor including a second vapor phase functionalization species that reacts with the first vapor phase functionalization species to form chemically-active functional groups at the single-walled carbon nanotube surface, producing a functionalized single-walled carbon nanotube surface that is reactive with material layer deposition precursors and exposing the functionalized nanotube surface to at least one material layer deposition precursor species that reacts with the chemically-active functional groups at the single-walled nanotube surface and deposits a material layer on the functionalized nanotube surface.

2. The method of claim 1 wherein the nanotube surface exposure is carried out at a temperature less than about 200° C.

3. The method of claim 2 wherein the nanotube surface exposure is carried out at a temperature less than about 100° C.

4. The method of claim 3 wherein the nanotube surface exposure is carried out at a temperature about 25° C.

5. The method of claim 1 wherein the first one vapor phase functionalization species includes NO$_2$.

6. The method of claim 1 wherein the carbon nanotube comprises a semiconducting carbon nanotube.

7. The method of claim 1 wherein the carbon nanotube is suspended between end supports during exposure of the nanotube surface.

8. The method of claim 1 wherein the carbon nanotube surface is exposed around a full nanotube circumference during exposure of the nanotube surface.

9. The method of claim 1 wherein the nanotube surface exposure is carried out at a temperature at which the first functionalization species is physisorbed on the nanotube surface for a duration sufficient for reaction with the second functionalization species to form the functionalization layer.

10. The method of claim 1 wherein the first functionalization species is selected from a group consisting of NO$_2$ and CH$_3$ONO.

11. The method of claim 1 wherein the second functionalization species is selected from a group consisting of trimethylaluminum, dimethylzinc, trimethylgallium, trimethylindium, trimethylbismuth, tetrakis(dimethylamido)hafnium, and tetrakis(dimethylamido)zirconium.

12. The method of claim 1 wherein the nanotube surface exposure comprises cyclically alternating exposure of the nanotube surface to the first vapor and the second vapor.

13. The method of claim 12 wherein the cyclically alternating exposure is carried out a number of exposure cycles that forms a functionalization layer of no greater than one monolayer in thickness.

14. The method of claim 12 wherein the cyclically alternating exposure is carried out a number of exposure cycles that forms a functionalization layer of no greater than about one nanometer in thickness.

15. The method of claim 12 wherein the cyclically alternating exposure is carried out no more than 100 exposure cycles.

16. The method of claim 12 wherein the cyclically alternating exposure is carried out between 25 and 50 exposure cycles.

17. The method of claim 12 wherein the cyclically alternating exposure comprises cycles of atomic layer deposition with the first functionalization species and the second functionalization species.

18. The method of claim 12 wherein the first functionalization species comprises nitrogen dioxide and the second functionalization species comprises trimethylaluminum.

19. The method of claim 1 further comprising exposing the functionalized nanotube surface to at least one vapor phase stabilization species that reacts with a functionalization layer on the nanotube surface to form a stabilization layer that stabilizes the functionalization layer against desorption from the nanotube surface while providing chemically functional groups at the nanotube surface, to produce a stabilized nanotube surface.

20. The method of claim 19 wherein the stabilization species reaction with the functionalization layer comprises covalent bonding to the functionalization layer.

21. The method of claim 19 wherein the at least one vapor phase stabilization species consists of water vapor and a species selected from a group consisting of trimethylaluminum, dimethylzinc, trimethylgallium, trimethylindium, trimethylbismuth, tetrakis(dimethylamido)hafnium, and tetrakis(dimethylamido)zirconium.

22. The method of claim 21 wherein the at least one vapor phase stabilization species comprises water vapor and trimethylaluminum.

23. The method of claim 22 wherein the stabilization layer comprises $Al_2O_3$.

24. The method of claim 19 wherein the functionalized nanotube surface exposure to the vapor phase stabilization species is carried out at a temperature at which the functionalization layer remains physisorbed on the nanotube surface for a duration sufficient for reaction with the stabilization species to form the stabilization layer.

25. The method of claim 24 wherein the functionalization species exposure of the nanotube and the stabilization species exposure of the nanotube are carried out at a temperature of about 25° C.

26. The method of claim 19 wherein the vapor stabilization species exposure of the functionalized nanotube surface comprises cyclically alternating exposure of the functionalized nanotube surface to a first stabilization precursor and a second stabilization precursor.

27. The method of claim 26 wherein the cyclically alternating exposure is carried out at least five exposure cycles.

28. The method of claim 26 wherein the cyclically alternating exposure comprises cycles of atomic layer deposition with the first stabilization precursor and the second stabilization precursor.

29. The method of claim 28 wherein the first stabilization precursor comprises water vapor and the second stabilization precursor comprises trimethylaluminum.

* * * * *